(12) United States Patent
Huh et al.

(10) Patent No.: US 9,502,669 B2
(45) Date of Patent: Nov. 22, 2016

(54) ORGANIC LIGHT EMITTING DIODE

(71) Applicant: LG CHEM, LTD., Seoul (KR)

(72) Inventors: Jungoh Huh, Daejeon (KR); Dong Hoon Lee, Daejeon (KR); Minseung Chun, Daejeon (KR); Boonjae Jang, Daejeon (KR); Wonik Jung, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 14/912,537

(22) PCT Filed: Jul. 16, 2015

(86) PCT No.: PCT/KR2015/007418
§ 371 (c)(1),
(2) Date: Feb. 17, 2016

(87) PCT Pub. No.: WO2016/024728
PCT Pub. Date: Feb. 18, 2016

(65) Prior Publication Data
US 2016/0293852 A1 Oct. 6, 2016

(30) Foreign Application Priority Data

Aug. 12, 2014 (KR) .................. 10-2014-0104507
Feb. 27, 2015 (KR) .................. 10-2015-0028550

(51) Int. Cl.
*H01L 51/50* (2006.01)
*H01L 51/00* (2006.01)
*C09K 11/02* (2006.01)
*C09K 11/06* (2006.01)

(52) U.S. Cl.
CPC ......... *H01L 51/0072* (2013.01); *C09K 11/025* (2013.01); *C09K 11/06* (2013.01); *H01L 51/0052* (2013.01); *H01L 51/0054* (2013.01); *H01L 51/0067* (2013.01); *C09K 2211/1011* (2013.01); *C09K 2211/1014* (2013.01); *H01L 51/5072* (2013.01); *H01L 51/5092* (2013.01); *H01L 2251/558* (2013.01)

(58) Field of Classification Search
None
See application file for complete search history.

(56) References Cited

U.S. PATENT DOCUMENTS

| | | | | |
|---|---|---|---|---|
| 8,368,062 B2* | 2/2013 | Lee | ...... | C07D 401/04 136/263 |
| 8,999,530 B2* | 4/2015 | Shin | ...... | H01L 51/0072 257/40 |
| 9,000,169 B2* | 4/2015 | Lee | ...... | C07D 471/04 313/504 |
| 9,349,964 B2* | 5/2016 | Chun | ...... | C09K 11/06 |
| 9,425,409 B2* | 8/2016 | Schwaiger | ...... | C07D 487/04 |
| 2007/0103065 A1* | 5/2007 | Fukuoka | ...... | H01L 51/5096 313/506 |
| 2013/0181196 A1 | 7/2013 | Lee et al. | | |
| 2014/0048792 A1 | 2/2014 | Chun et al. | | |
| 2014/0088305 A1 | 3/2014 | Parham et al. | | |

FOREIGN PATENT DOCUMENTS

| | | |
|---|---|---|
| KR | 10-2014-0065357 A | 5/2014 |
| WO | 2012/163465 A1 | 12/2012 |
| WO | 2013/009013 A2 | 1/2013 |
| WO | 2013/051875 A3 | 4/2013 |

* cited by examiner

*Primary Examiner* — Dawn Garrett
(74) *Attorney, Agent, or Firm* — Dentons US LLP

(57) ABSTRACT

The present specification relates to an organic light emitting diode.

13 Claims, 1 Drawing Sheet

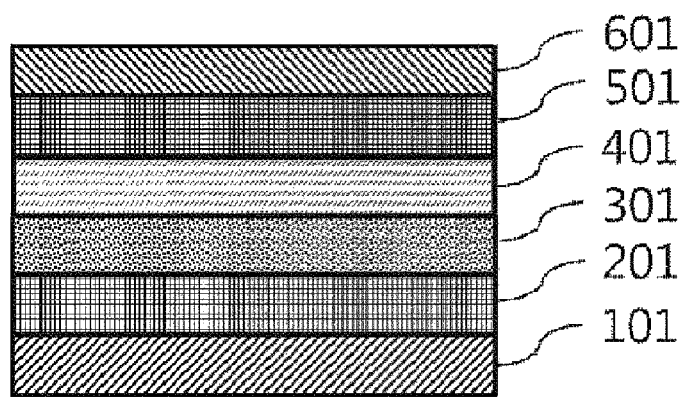

ORGANIC LIGHT EMITTING DIODE

This application is a National Stage Entry of International Application No. PCT/KR2015/007418, filed Jul. 16, 2015, and claims the benefit of and priority to Korean Application No. 10-2014-0104507, filed Aug. 12, 2014 and Korean Application No. 10-2015-0028550, filed Feb. 27, 2015, all of which are incorporated herein by reference in their entirety for all purposes as if fully set forth herein.

TECHNICAL FIELD

The present specification claims to and the benefit of Korean Patent Application Nos. 10-2014-0104507 and 10-2015-0028550 filed in the Korean Intellectual Property Office on Aug. 12, 2014 and Feb. 27, 2015, respectively, the entire contents of which are incorporated herein by reference.

The present specification relates to an organic light emitting diode.

BACKGROUND ART

An organic light emission phenomenon is one of the examples of converting current into visible rays through an internal process of a specific organic molecule. The principle of the organic light emission phenomenon is as follows.

When an organic material layer is disposed between a positive electrode and a negative electrode, if voltage is applied between the two electrodes, electrons and holes are injected from the negative electrode and the positive electrode, respectively, into the organic material layer. The electrons and the holes which are injected into the organic material layer are recombined to form an exciton, and the exciton falls down again to the ground state to emit light. An organic light emitting diode using this principle may be composed of a negative electrode, a positive electrode, and an organic material layer disposed therebetween, for example, an organic material layer including a hole injection layer, a hole transporting layer, a light emitting layer, and an electron transporting layer.

The materials used in the organic light emitting diode are mostly pure organic materials or complex compounds in which organic materials and metals form a complex, and may be classified into a hole injection material, a hole transporting material, a light emitting material, an electron transporting material, an electron injection material, and the like according to the use thereof. Here, an organic material having a p-type property, that is, an organic material, which is easily oxidized and electrochemically stable when the material is oxidized, is usually used as the hole injection material or the hole transporting material. Meanwhile, an organic material having an n-type property, that is, an organic material, which is easily reduced and electrochemically stable when the material is reduced, is usually used as the electron injection material or the electron transporting material. As the light emitting layer material, a material having both p-type and n-type properties, that is, a material, which is stable during both the oxidation and reduction states, is preferred, and when an exciton is formed, a material having high light emitting efficiency for converting the exciton into light is preferred. There is a need for developing an organic light emitting diode having high efficiency in the art.

CITATION LIST

Non-Patent Document

Applied Physics Letters 51, p. 913, 1987

DETAILED DESCRIPTION OF THE INVENTION

Technical Problem

An object of the present specification is to provide an organic light emitting diode having high light emitting efficiency.

Technical Solution

The present specification provides an organic light emitting diode including: a cathode; an anode provided to face the cathode; a light emitting layer provided between the cathode and the anode; an electron transporting layer provided between the cathode and the light emitting layer; and an electron adjusting layer provided between the light emitting layer and the electron transporting layer, in which the electron transporting layer includes an organic compound containing an aromatic hetero ring, the electron adjusting layer includes a heterocyclic compound represented by the following Formula 1, and an ionization potential ($Ip_m$) of the electron transporting layer is larger than an ionization potential ($IP_a$) of the electron adjusting layer.

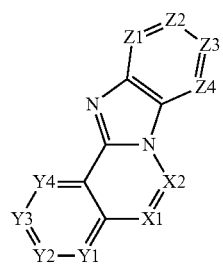

[Formula 1]

In Formula 1,

X1 is CR1 or N and X2 is CR2 or N,

Y1 is CR5 or N, Y2 is CR6 or N, Y3 is CR7 or N, and Y4 is CR8 or N,

Z1 is CR9 or N, Z2 is CR10 or N, Z3 is CR11 or N, and Z4 is CR12 or N,

X1, X2, Y1 to Y4, and Z1 to Z4 are not simultaneously N, and

R1, R2, and R5 to R12 are the same as or different from each other, and are each independently hydrogen; deuterium; a substituted or unsubstituted aryl group having 6 to 30 carbon atoms; a substituted or unsubstituted heterocyclic group having 2 to 30 carbon atoms; or a substituted or unsubstituted phosphine oxide group, or adjacent substituents of R1, R2, and R5 to R12 combine with each other to form a substituted or unsubstituted hydrocarbon ring; or a substituted or unsubstituted hetero ring.

Advantageous Effects

An organic light emitting diode according to an exemplary embodiment of the present specification provides low driving voltage and/or high efficiency.

BRIEF DESCRIPTION OF DRAWINGS

FIG. 1 illustrates an example of an organic light emitting diode according to an exemplary embodiment of the present specification.

EXPLANATION OF REFERENCE NUMERALS AND SYMBOLS

101: Substrate
201: Anode
301: Light emitting
401: Electron adjusting layer
501: Electron transporting layer
601: Cathode

BEST MODE

Hereinafter, the present specification will be described in more detail.

When one part "includes" one constituent element in the present specification, unless otherwise specifically described, this does not mean that another constituent element is excluded, but means that another constituent element may be further included.

The present specification provides an organic light emitting diode including: a cathode; an anode provided to face the cathode; a light emitting layer provided between the cathode and the anode; an electron transporting layer provided between the cathode and the light emitting layer; and an electron adjusting layer provided between the light emitting layer and the electron transporting layer, in which the transporting layer includes an organic compound containing an aromatic hetero ring, and the electron adjusting layer includes the heterocyclic compound represented by Formula 1.

The electron adjusting layer means a layer which serves to adjust the mobility of electrons according to the energy level of a light emitting layer in an organic light emitting diode.

In an exemplary embodiment of the present specification, the ionization potential ($Ip_m$) of the electron transporting layer is larger than the ionization potential ($IP_a$) of the electron adjusting layer. In this case, the electron adjusting layer may serve as a hole barrier such that holes supplied from the anode do not migrate into the cathode, and the capacity of the electron adjusting layer, which adjusts the electron mobility, may be maximized.

In an exemplary embodiment of the present specification, the electron adjusting layer is provided to be in contact with the light emitting layer. In this case, the electron adjusting layer may serve to adjust the electron mobility, and simultaneously, may serve as a hole barrier such that holes supplied from the anode do not migrate into the cathode, particularly, the electron transporting layer.

In an exemplary embodiment of the present specification, the thickness of the electron transporting layer is larger than that of the electron adjusting layer. When the thickness of the electron adjusting layer, which adjusts the movement of electrons, is larger than that of the electron transporting layer, the amount of electrons, which may move to the light emitting layer per unit time, is decreased, and thus, holes may be relatively excessively supplied from the anode to the cathode, so that the efficiency of the diode may be decreased. Therefore, when the thickness of the electron transporting layer is larger than that of the electron adjusting layer, the amount of electrons, which may move to the light emitting layer per unit time, is appropriately adjusted, and thus, may be balanced with the amount of holes supplied from the anode, so that it may be expected that the formation of excitons of the light emitting layer is maximized and the diode has a high efficiency.

In an exemplary embodiment of the present specification, the light emitting layer includes a host and a dopant.

In another exemplary embodiment, the dopant is a fluorescent dopant.

In still another exemplary embodiment, the dopant is a blue fluorescent dopant.

The organic light emitting diode according to an exemplary embodiment of the present specification emits blue fluorescent light.

The organic light emitting diode currently used in the art is used as a combination of blue fluorescence, blue and red phosphorescence or a combination of blue fluorescence, green fluorescence and red phosphorescence, and the like. However, the organic light emitting diode which emits blue fluorescent light having high exciton energy has a problem in that the service life of the diode is significantly reduced relatively compared to that of the organic light emitting diode which emits green or red light. That is, since the high exciton energy of blue fluorescence is concentrated in a local region which is a narrow light emission region, energy stress imposed on the material is increased, and as a result, a low service life is exhibited. Therefore, in order to overcome the aforementioned problems, a separate electron adjusting layer in addition to the electron transporting layer is provided in the light emitting layer and the electron transporting layer to artificially adjust the amount of electrons, so that the efficiency and service life of the organic light emitting diode may be improved.

In an exemplary embodiment of the present specification, the electron transporting layer includes an organic compound containing an aromatic hetero ring.

In the present specification, the meaning of containing an aromatic hetero ring may mean that in the compound to be included in the electron transporting layer, an aromatic hetero ring is included as a core, or at least one of the substituents of the compounds included in the electron transporting layer is an aromatic hetero ring.

In another exemplary embodiment, the electron transporting layer includes an organic compound containing a nitrogen-containing monocyclic ring or a nitrogen-containing polycyclic ring.

The nitrogen-containing monocyclic ring means a ring in which at least one nitrogen atom is substituted instead of carbon in the ring member of the monocyclic hydrocarbon, and examples thereof include a pyridine group, a pyrimidine group, a pyridazine group, a pyrazine group, a triazine group, a tetrazine group, a pentazine group, a pyrrole group, a thiazole group, an imidazole group, an oxazole group, and the like, but the nitrogen-containing monocyclic ring is not limited thereto.

The nitrogen-containing polycyclic ring means a ring in which at least one nitrogen atom is substituted, instead of carbon, in the ring member of the polycyclic hydrocarbon, and examples thereof include a quinoline group, a cinnoline group, a quinazoline group, a quinoxaline group, a pyridopyrazine group, a pyrazinopyrazine group, a pyrazinoquinoxaline group, an acridine group, a phenanthroline group, a benzimidazole group, a benzimidazophenanthridine group, a benzobenzimidazophenanthridine group, and the like, but the nitrogen-containing polycyclic ring is not limited thereto.

In an exemplary embodiment of the present specification, the electron transporting layer includes an organic compound containing a nitrogen-containing monocyclic ring.

In an exemplary embodiment of the present specification, in the organic compound containing an aromatic hetero ring, the aromatic hetero ring is included as a core.

In an exemplary embodiment of the present specification, X1 and X2 are each CR1 and CR2, and R1 and R2 combine with each other to form a substituted or unsubstituted hydrocarbon ring.

In an exemplary embodiment of the present specification, R1 and R2 combine with each other to form a substituted or unsubstituted benzene ring.

In an exemplary embodiment of the present specification, R1 and R2 combine with each other to form a benzene ring.

In an exemplary embodiment of the present specification, X1 is N.

In another exemplary embodiment, X2 is CR2.

In an exemplary embodiment of the present specification, R7 and R8 combine with each other to form a hydrocarbon ring.

In an exemplary embodiment of the present specification, R7 and R8 combine with each other to form a benzene ring.

In an exemplary embodiment of the present specification, R5 and R6 combine with each other to form a hydrocarbon ring.

In another exemplary embodiment, R5 and R6 combine with each other to form a benzene ring.

In the present specification, the benzene ring or hydrocarbon ring may be substituted or unsubstituted.

In an exemplary embodiment of the present specification, the heterocyclic compound represented by Formula 1 is represented by the following Formula 1A or Formula 1B.

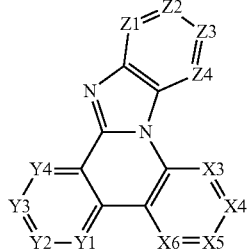

[Formula 1A]

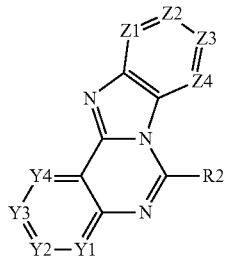

[Formula 1B]

In Formulae 1A and 1B,
Y1 to Y4, Z1 to Z4, and R2 are the same as those defined in Formula 1, X3 to X6 are the same as or different from each other, and are each independently CR3 or N, and R3's are each independently hydrogen; deuterium; a substituted or unsubstituted aryl group having 6 to 30 carbon atoms; a substituted or unsubstituted heterocyclic group having 2 to 30 carbon atoms; or a substituted or unsubstituted phosphine oxide group, or adjacent substituents combine with each other to form a substituted or unsubstituted hydrocarbon ring; or a substituted or unsubstituted hetero ring.

In an exemplary embodiment of the present specification, Y1 is CR5.

In another exemplary embodiment, Y2 is CR6.

In still another exemplary embodiment, Y3 is CR7.

In an exemplary embodiment of the present specification, Y4 is CR8.

In an exemplary embodiment of the present specification, Z1 is CR9.

In another exemplary embodiment, Z2 is CR10.

In an exemplary embodiment of the present specification, Z3 is CR11.

In an exemplary embodiment of the present specification, Z4 is CR12.

In an exemplary embodiment of the present specification, X3 to X6 are each CR3.

In an exemplary embodiment of the present specification, each CR3 of X3 to X6 may be the same as or different from each other.

In an exemplary embodiment of the present specification, the heterocyclic compound represented by Formula 1 is represented by any one of the following Formulae 1-1 to 1-4.

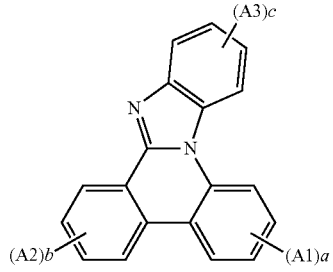

[Formula 1-1]

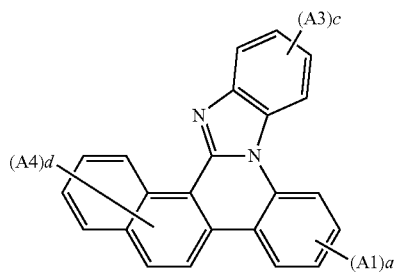

[Formula 1-2]

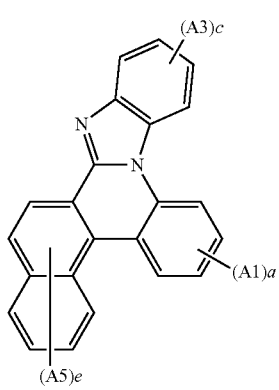

[Formula 1-3]

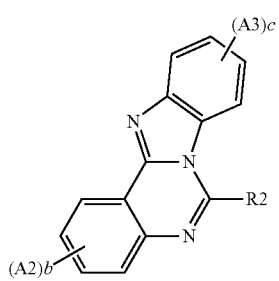

[Formula 1-4]

In Formulae 1-1 to 1-4, a, b, and c are each an integer of 1 to 4, d and e are each an integer of 1 to 6, and when a, b, c, d, and e are each an integer of 2 or more, the two or more structures in the parenthesis are the same as or different from each other, and A1 to A5 and R2 are the same as or different from each other, and are each independently hydrogen; deuterium; a substituted or unsubstituted aryl group having 6 to 30 carbon atoms; a substituted or unsubstituted heterocyclic group having 2 to 30 carbon atoms; or a substituted or unsubstituted phosphine oxide group.

In an exemplary embodiment of the present specification, at least one of R1, R2, and R5 to R12 is an aryl group which is unsubstituted or substituted with one or two or more substituents selected from the group consisting of a cyano group, an aryl group, a heterocyclic group, and a phosphine oxide group; or a phosphine oxide group which is unsubstituted or substituted with one or two or more substituents selected from the group consisting of a cyano group, an aryl group, a heterocyclic group, and a phosphine oxide group, or adjacent substituents combine with each other to form a hydrocarbon ring which is unsubstituted or substituted with one or two or more substituents selected from the group consisting of a cyano group, an aryl group, a heterocyclic group, and a phosphine oxide group.

In an exemplary embodiment of the present specification, at least one of R1 to R3 and R5 to R12 is an aryl group which is unsubstituted or substituted with one or two or more substituents selected from the group consisting of a cyano group, an aryl group, a heterocyclic group, and a phosphine oxide group; or a phosphine oxide group which is unsubstituted or substituted with one or two or more substituents selected from the group consisting of a cyano group, an aryl group, a heterocyclic group, and a phosphine oxide group, or adjacent substituents combine with each other to form a benzene ring which is unsubstituted or substituted with one or two or more substituents selected from the group consisting of a cyano group, an aryl group, a heterocyclic group, and a phosphine oxide group.

In an exemplary embodiment of the present specification, R1 to R3 and R5 to R12 are the same as or different from each other, and are each independently hydrogen; an aryl group which is unsubstituted or substituted with one or two or more substituents selected from the group consisting of a cyano group, an aryl group, a heterocyclic group, and a phosphine oxide group; or a phosphine oxide group which is unsubstituted or substituted with one or two or more substituents selected from the group consisting of a cyano group, an aryl group, a heterocyclic group, and a phosphine oxide group, or adjacent substituents combine with each other to form a benzene ring which is unsubstituted or substituted with one or two or more substituents selected from the group consisting of a cyano group, an aryl group, a heterocyclic group, and a phosphine oxide group.

In an exemplary embodiment of the present specification, R1 to R3 and R5 to R12 are the same as or different from each other, and are each independently hydrogen; a phenyl group which is substituted with a pyridine group; a phenyl group which is substituted with a quinoline group; a phenyl group which is substituted with a pyrene group; a naphthyl group which is substituted with a phenyl group substituted with a naphthyl group; a naphthyl group which is substituted with a phenanthrenyl group; a fluorenyl group which is substituted one or two or more times with a substituent selected from the group consisting of Formula 1B and a phenyl group; a naphthyl group which is substituted with a phenyl group substituted with a cyano group; a phenyl group which is substituted with an anthracene group substituted with a naphthyl group; a naphthyl group which is substituted with a phosphine oxide group substituted with an aryl group; a phosphine oxide group which is substituted with a naphthyl group; a naphthyl group; a phenyl group which is substituted with a napthyl group; a biphenyl group; a terphenyl group; a triphenylene group; a naphthyl group which is substituted with a phenyl group; or a phenanthrenyl group, or adjacent substituents combine with each other to form a benzene ring which is unsubstituted or substituted with a substituent selected from the group consisting of a phenyl group which is substituted with a pyridine group; a phenyl group which is substituted with a quinoline group; a phenyl group which is substituted with a pyrene group; a naphthyl group which is substituted with a phenyl group substituted with a naphthyl group; a naphthyl group which is substituted with a phenanthrenyl group; a fluorenyl group which is substituted one or two or more times with a substituent selected from the group consisting of Formula 1B and a phenyl group; a naphthyl group which is substituted with a phenyl group substituted with a cyano group; a phenyl group which is substituted with an anthracene group substituted with a naphthyl group; a naphthyl group which is substituted with a phosphine oxide group substituted with an aryl group; a phosphine oxide group which is substituted with a naphthyl group; a naphthyl group; a phenyl group which is substituted with a napthyl group; a biphenyl group; a terphenyl group; a triphenylene group; a naphthyl group which is substituted with a phenyl group; and a phenanthrenyl group.

In an exemplary embodiment of the present specification, R1 is hydrogen.

In an exemplary embodiment of the present specification, R2 is hydrogen.

In another exemplary embodiment, R2 is a substituted or unsubstituted aryl group.

In an exemplary embodiment of the present specification, R2 is an aryl group which is unsubstituted or substituted with one or two or more substituents selected from the group consisting of a cyano group, an aryl group, a heterocyclic group, and a phosphine oxide group.

In an exemplary embodiment of the present specification, R2 is an aryl group which is substituted with a substituted or unsubstituted aryl group.

In another exemplary embodiment, R2 is an aryl group which is substituted with a pyrene group.

In still another exemplary embodiment, R2 is a phenyl group which is substituted with a substituted or unsubstituted aryl group.

In yet another exemplary embodiment, R2 is a phenyl group which is substituted with a pyrene group.

In still yet another exemplary embodiment, R2 is a phenyl group which is substituted with a substituted or unsubstituted anthracene group.

In further another exemplary embodiment, R2 is a phenyl group which is substituted with an anthracene group substituted with a naphthyl group.

In further yet another exemplary embodiment, R2 is a naphthyl group which is substituted with a substituted or unsubstituted aryl group.

In an exemplary embodiment of the present specification, R2 is a naphthyl group which is substituted with a phenanthrenyl group.

In another exemplary embodiment, R2 is a naphthyl group which is substituted with a substituted or unsubstituted phenyl group.

In still another exemplary embodiment, R2 is a naphthyl group which is substituted with a phenyl group substituted with a cyano group.

In yet another exemplary embodiment, R2 is a naphthyl group which is substituted with a phenyl group substituted with a naphthyl group.

In an exemplary embodiment of the present specification, R2 is a fluorenyl group which is substituted one or two or more times with a substituent selected from the group consisting of Formula 1B which is substituted with substituted or unsubstituted Formula 1B and a phenyl group.

In another exemplary embodiment, R2 is a fluorenyl group which is substituted with Formula 1B and a naphthyl group.

In an exemplary embodiment of the present specification, R3 is hydrogen.

In an exemplary embodiment of the present specification, R3 is a substituted or unsubstituted aryl group.

In an exemplary embodiment of the present specification, R3 is a phosphine oxide group which is unsubstituted or substituted with one or two or more substituents selected from the group consisting of a cyano group, an aryl group, a heterocyclic group, and a phosphine oxide group.

In another exemplary embodiment, R3 is an aryl group which is substituted with an aryl group.

In an exemplary embodiment of the present specification, R3 is an aryl group which is substituted with a naphthyl group.

In another exemplary embodiment, R3 is a phenyl group which is substituted with a naphthyl group.

In an exemplary embodiment of the present specification, R3 is an aryl group which is substituted with a phenyl group.

In an exemplary embodiment of the present specification, R3 is a phenyl group which is substituted with an aryl group.

In another exemplary embodiment of the present specification, R3 is a naphthyl group which is substituted with an aryl group.

In another exemplary embodiment, R3 is a phenyl group which is substituted with a phenyl group.

In still another exemplary embodiment, R3 is a naphthyl group which is substituted with a phenyl group.

In an exemplary embodiment of the present specification, R3 is an unsubstituted aryl group.

In one exemplary embodiment, R3 is a naphthyl group.

In still another exemplary embodiment, R3 is a phenanthrenyl group.

In another exemplary embodiment, R3 is a terphenyl group.

In still another exemplary embodiment, R3 is a triphenylene group.

In yet another exemplary embodiment, R3 is a biphenyl group.

In one exemplary embodiment, R3 is an aryl group which is substituted with a heterocyclic group.

In another exemplary embodiment, R3 is an aryl group which is substituted with a pyridine group.

In still another exemplary embodiment, R3 is a phenyl group which is substituted with a pyridine group.

In one exemplary embodiment, R3 is an aryl group which is substituted with a phosphine oxide group.

In one exemplary embodiment, R3 is a naphthyl group which is substituted with a phosphine oxide group.

In one exemplary embodiment, R3 is a naphthyl group which is substituted with a phosphine oxide group substituted with an aryl group.

In one exemplary embodiment, R3 is a naphthyl group which is substituted with a phosphine oxide group substituted with a phenyl group.

In another exemplary embodiment, R3 is a phosphine oxide group which is substituted with an aryl group.

In an exemplary embodiment of the present specification, R3 is a phosphine oxide group which is substituted with a naphthyl group.

In an exemplary embodiment of the present specification, R5 is hydrogen.

In an exemplary embodiment of the present specification, R6 is hydrogen.

In another exemplary embodiment, R6 is a substituted or unsubstituted aryl group.

In an exemplary embodiment of the present specification, R6 is an aryl group which is unsubstituted or substituted with one or two or more substituents selected from the group consisting of a cyano group, an aryl group, a heterocyclic group, and a phosphine oxide group.

In one exemplary embodiment, R6 is an aryl group which is substituted with a heterocyclic group.

In another exemplary embodiment, R6 is an aryl group which is substituted with a pyridine group.

In still another exemplary embodiment, R6 is a phenyl group which is substituted with a pyridine group.

In an exemplary embodiment of the present specification, R7 is hydrogen.

In one exemplary embodiment, R7 is an aryl group which is substituted with a phosphine oxide group.

In one exemplary embodiment, R7 is a naphthyl group which is substituted with a phosphine oxide group.

In one exemplary embodiment, R7 is a naphthyl group which is substituted with a phosphine oxide group substituted with an aryl group.

In one exemplary embodiment, R7 is a naphthyl group which is substituted with a phosphine oxide group substituted with a phenyl group.

In another exemplary embodiment, R7 is a substituted or unsubstituted aryl group.

In an exemplary embodiment of the present specification, R7 is an aryl group which is unsubstituted or substituted with one or two or more substituents selected from the group consisting of a cyano group, an aryl group, a heterocyclic group, and a phosphine oxide group.

In one exemplary embodiment, R7 is an aryl group which is substituted with a heterocyclic group.

In another exemplary embodiment, R7 is an aryl group which is substituted with a quinoline group.

In still another exemplary embodiment, R7 is a phenyl group which is substituted with a quinoline group.

In an exemplary embodiment of the present specification, R8 is hydrogen.

In an exemplary embodiment of the present specification, R9 is hydrogen.

In an exemplary embodiment of the present specification, R10 is hydrogen.

In another exemplary embodiment, R10 is a substituted or unsubstituted aryl group.

In an exemplary embodiment of the present specification, R10 is an aryl group which is unsubstituted or substituted with one or two or more substituents selected from the group consisting of a cyano group, an aryl group, a heterocyclic group, and a phosphine oxide group.

In one exemplary embodiment, R10 is an aryl group which is substituted with a heterocyclic group.

In another exemplary embodiment, R10 is an aryl group which is substituted with a quinoline group.

In still another exemplary embodiment, R10 is a phenyl group substituted with a quinoline group.

In an exemplary embodiment of the present specification, R11 is hydrogen.

In an exemplary embodiment of the present specification, R12 is hydrogen.

In an exemplary embodiment of the present specification, at least one of A1 to A3 is an aryl group which is unsubstituted or substituted with one or two or more substituents selected from the group consisting of a cyano group, an aryl group, a heterocyclic group, and a phosphine oxide group; or a phosphine oxide group which is unsubstituted or substituted with one or two or more substituents selected from the group consisting of a cyano group, an aryl group, a heterocyclic group, and a phosphine oxide group.

In an exemplary embodiment of the present specification, A1 to A5 are the same as or different from each other, and are each independently hydrogen; an aryl group which is unsubstituted or substituted with one or two or more substituents selected from the group consisting of a cyano group, an aryl group, a heterocyclic group, and a phosphine oxide group; or a phosphine oxide group which is unsubstituted or substituted with one or two or more substituents selected from the group consisting of a cyano group, an aryl group, a heterocyclic group, and a phosphine oxide group.

In an exemplary embodiment of the present specification, A1 to A5 are the same as or different from each other, and are each independently hydrogen; a phenyl group which is substituted with a pyridine group; a phenyl group which is substituted with a quinoline group; a phenyl group which is substituted with a pyrene group; a naphthyl group which is substituted with a phenyl group substituted with a naphthyl group; a naphthyl group which is substituted with a phenanthrenyl group; a fluorenyl group which is substituted one or two or more times with a substituent selected from the group consisting of Formula 1B and a phenyl group; a naphthyl group which is substituted with a phenyl group substituted with a cyano group; a phenyl group which is substituted with an anthracene group substituted with a naphthyl group; a naphthyl group which is substituted with a phosphine oxide group substituted with an aryl group; a phosphine oxide group which is substituted with a naphthyl group; a naphthyl group; a phenyl group which is substituted with a napthyl group; a biphenyl group; a terphenyl group; a triphenylene group; a naphthyl group which is substituted with a phenyl group; or a phenanthrenyl group.

In an exemplary embodiment of the present specification, at least one of R1 to R3 and R5 to R12 is selected from the following structures.

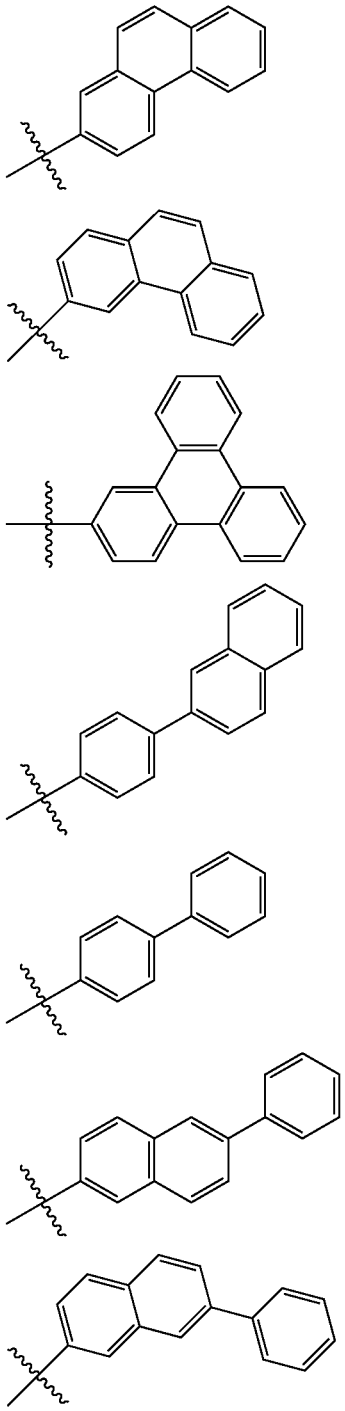

-continued
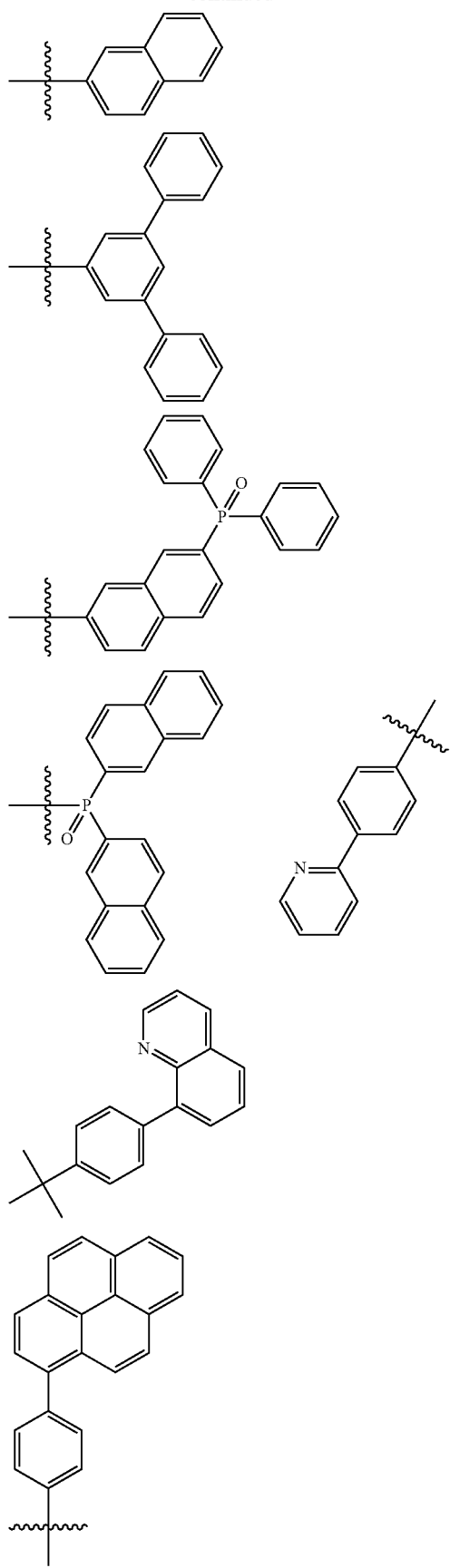
-continued
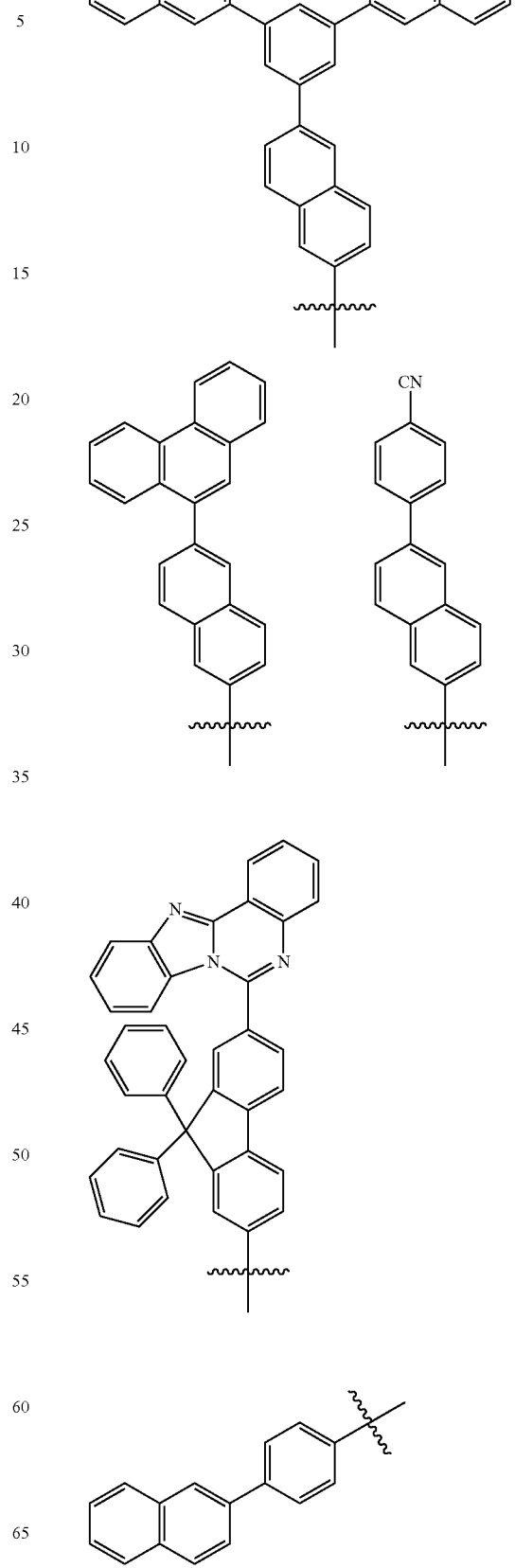

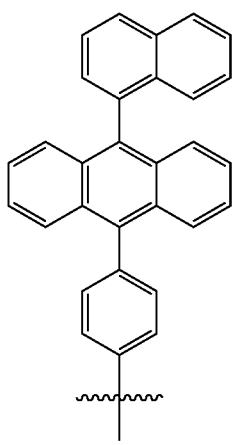
In an exemplary embodiment of the present specification, at least one of A1 to A5 may be selected from the aforementioned structures.
In an exemplary embodiment of the present specification, the heterocyclic compound represented by Formula 1 is represented by any one of the following Formulae 1-1-1 to 1-1-7.
[Formula 1-1-1]
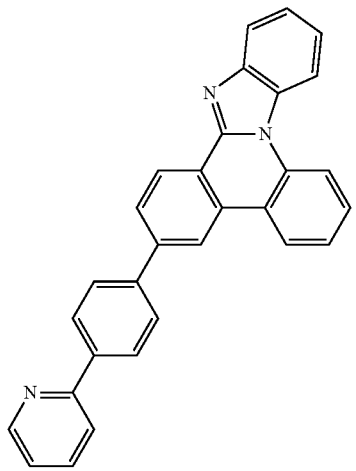
[Formula 1-1-2]
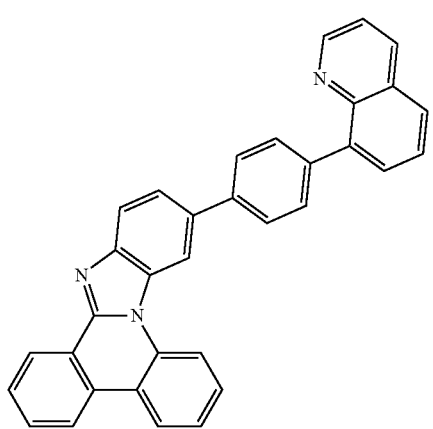
[Formula 1-1-3]
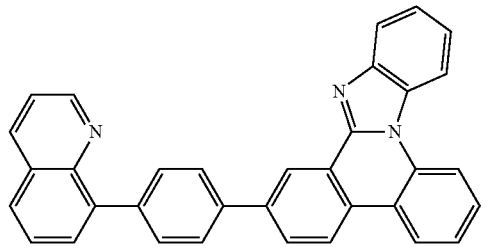
[Formula 1-1-4]
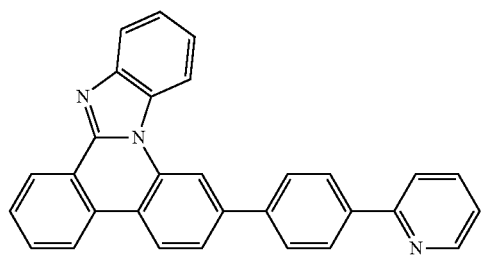
[Formula 1-1-5]
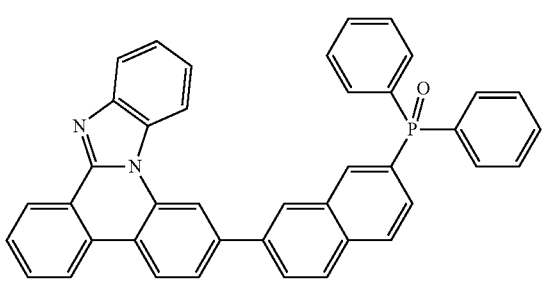
[Formula 1-1-6]
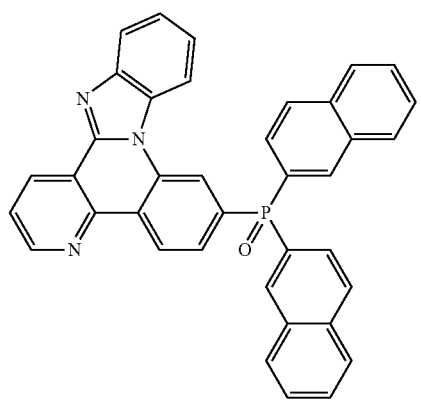
[Formula 1-1-7]
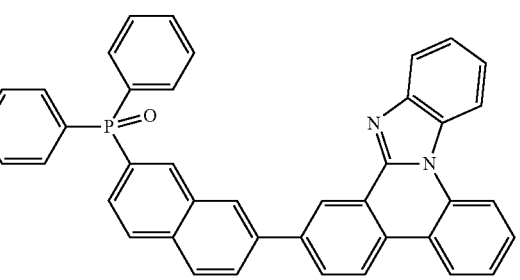

In an exemplary embodiment of the present specification, the heterocyclic compound represented by Formula 1 is represented by any one of the following Formulae 1-2-1 to 1-2-10.
[Formula 1-2-1]
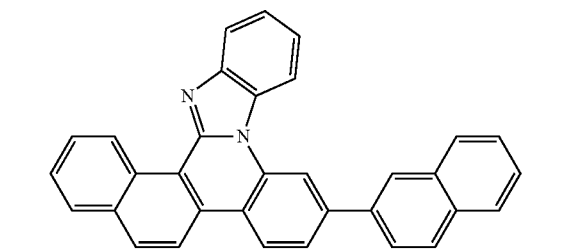
[Formula 1-2-2]
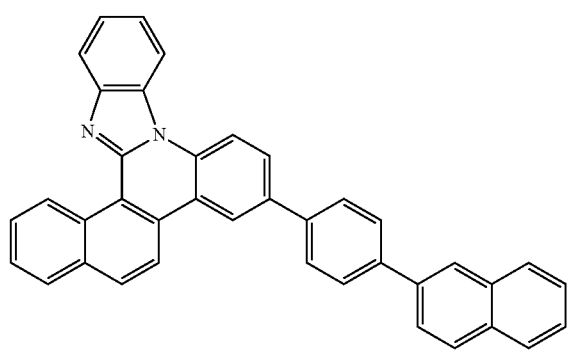
[Formula 1-2-3]
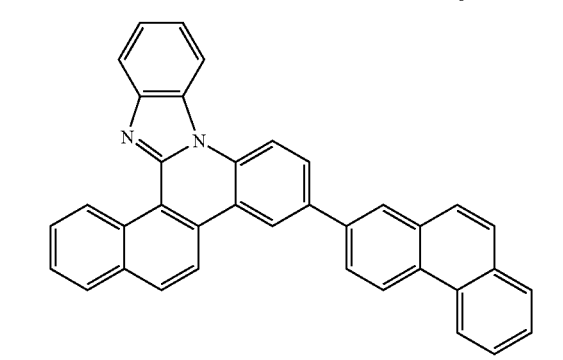
[Formula 1-2-4]
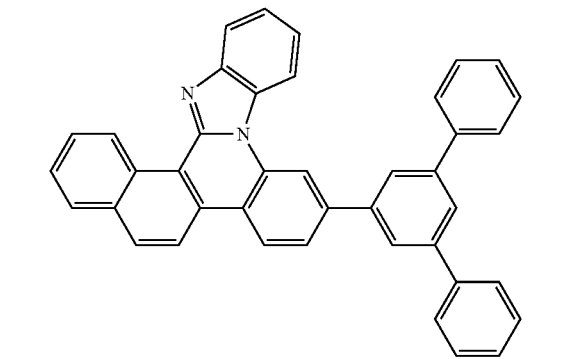
[Formula 1-2-5]
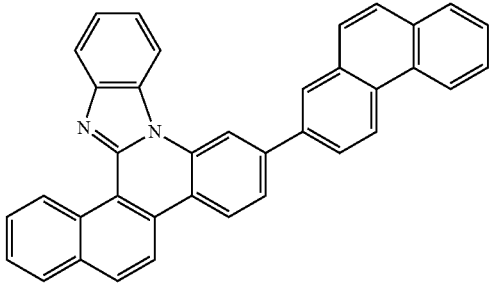
[Formula 1-2-6]
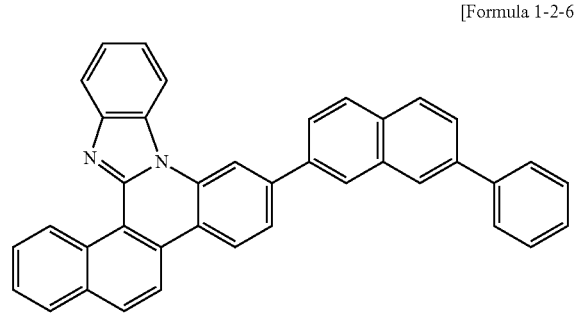
[Formula 1-2-7]
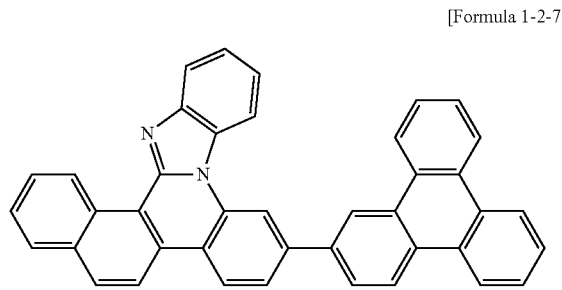
[Formula 1-2-8]
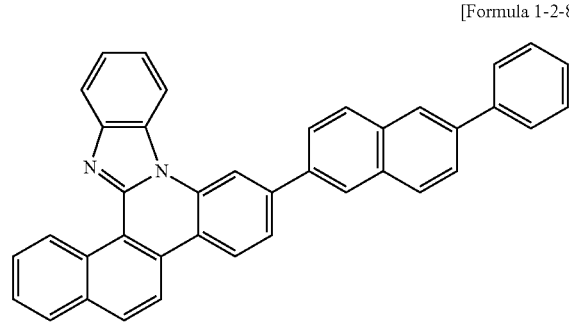
[Formula 1-2-9]
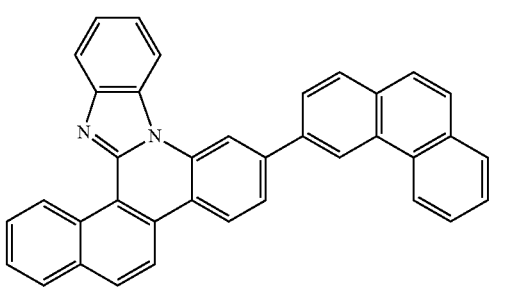

[Formula 1-2-10]

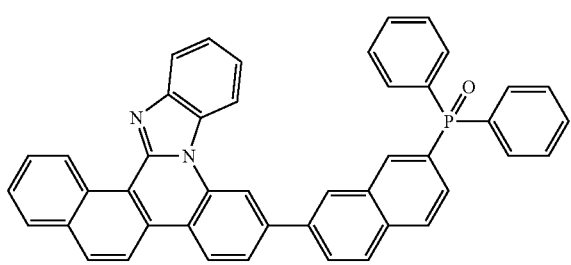

In an exemplary embodiment of the present specification, the heterocyclic compound represented by Formula 1 is represented by any one of the following Formulae 1-3-1 to 1-3-5.

[Formula 1-3-1]

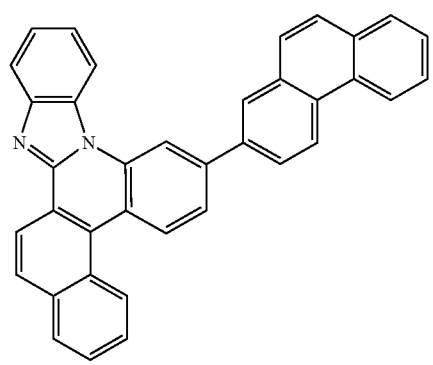

[Formula 1-3-2]

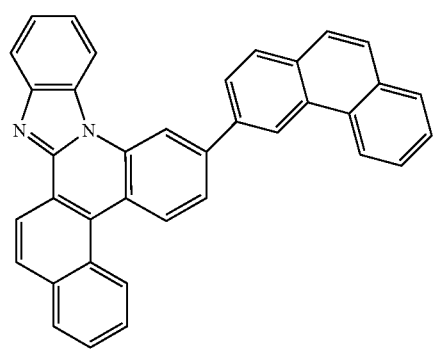

[Formula 1-3-3]

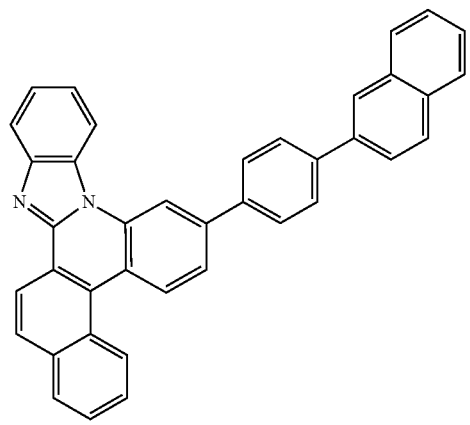

[Formula 1-3-4]

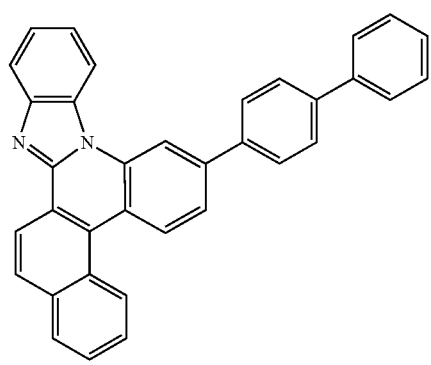

[Formula 1-3-5]

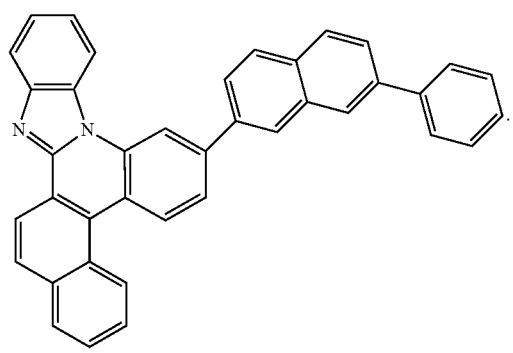

In an exemplary embodiment of the present specification, the heterocyclic compound represented by Formula 1 is represented by any one of the following Formulae 1-4-1 to 1-4-7.

[Formula 1-4-1]

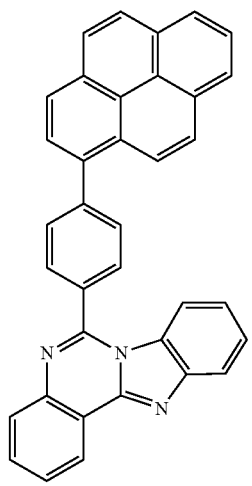

[Formula 1-4-2]
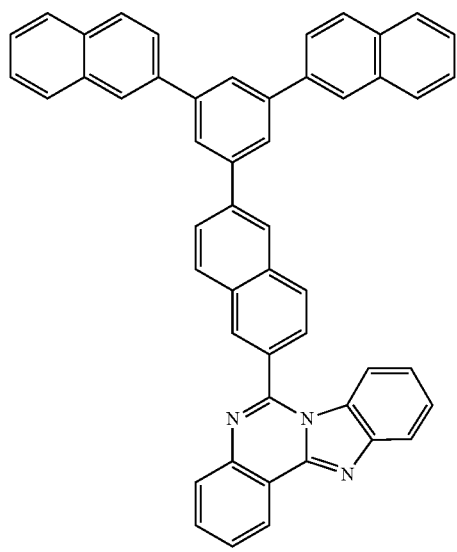
[Formula 1-4-4]
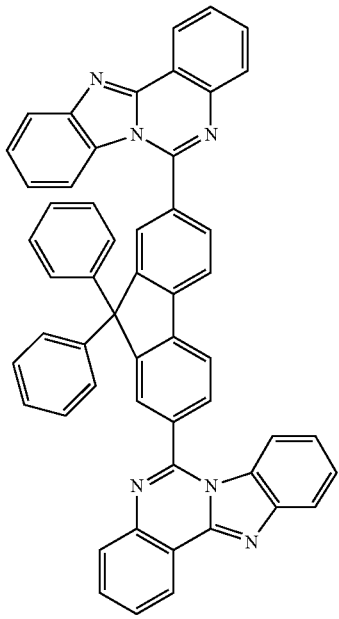
[Formula 1-4-5]
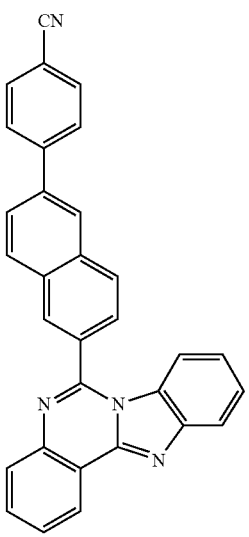
[Formula 1-4-3]
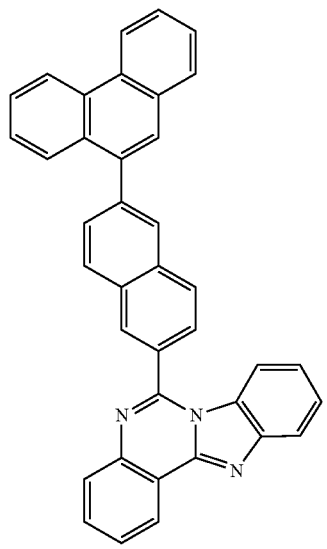
[Formula 1-4-6]
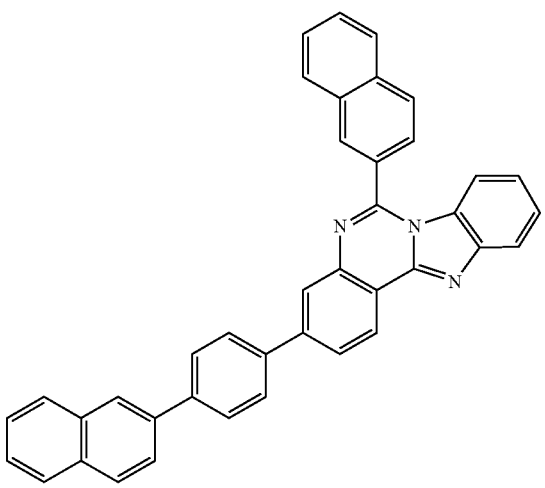

-continued

[Formula 1-4-7]

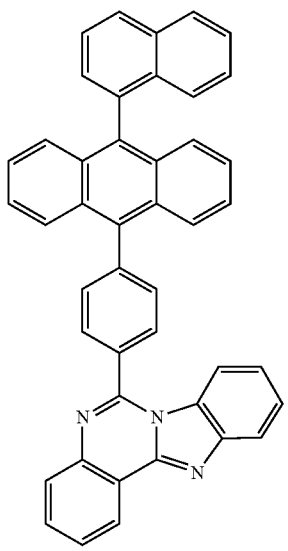

In an exemplary embodiment of the present specification, the electron transporting layer includes an organic compound containing an aromatic hetero ring represented by the following Formula 2.

[Formula 2]

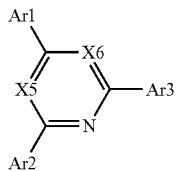

In Formula 2,

X5 and X6 are the same as or different from each other, and are each independently N or CH, and Ar1 to Ar3 are the same as or different from each other, and are each independently a substituted or unsubstituted aryl group having 6 to 30 carbon atoms; or a substituted or unsubstituted heterocyclic group having 2 to 30 carbon atoms.

In an exemplary embodiment of the present specification, at least of Ar1 to Ar3 is represented by the following Formula 3.

[Formula 3]

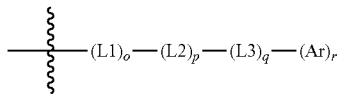

In Formula 3, o, p, and q are 0 or 1,

1≤o+p+q≤3, r is 1 or 2, and when r is 2, two Ar's are the same as or different from each other, L1 to L3 are the same as or different from each other, and are each independently a phenylene group; or a naphthalene group; or a fluorenylene group, and Ar is an aryl group which is unsubstituted or substituted with one or two or substituents selected from the group consisting of an aryl group and a heterocyclic group; or a heterocyclic group which is unsubstituted or substituted with one or two or more substituents selected from the group consisting of an aryl group and a heterocyclic group.

In an exemplary embodiment of the present specification, o is 1.

In another exemplary embodiment, o is 0.

In an exemplary embodiment of the present specification, p is 0.

In another exemplary embodiment, p is 1.

In an exemplary embodiment of the present specification, q is 0.

In another exemplary embodiment, q is 1.

In an exemplary embodiment of the present specification, r is 1.

In another exemplary embodiment, r is 2.

In an exemplary embodiment of the present specification, L1 is a phenylene group.

In another exemplary embodiment, L1 is a naphthalene group.

In still another exemplary embodiment, L1 is a fluorenylene group.

In an exemplary embodiment of the present specification, L2 is a phenylene group.

In another exemplary embodiment, L2 is a naphthalene group.

In still another exemplary embodiment, L2 is a fluorenylene group.

In an exemplary embodiment of the present specification, L3 is a phenylene group.

In another exemplary embodiment, L3 is a naphthalene group.

In still another exemplary embodiment, L3 is a fluorenylene group.

In an exemplary embodiment of the present specification, Ar is an aryl group which is unsubstituted or substituted with one or two or substituents selected from the group consisting of an aryl group and a heterocyclic group; or a heterocyclic group which is unsubstituted or substituted with one or two or more substituents selected from the group consisting of an aryl group and a heterocyclic group.

In one exemplary embodiment, Ar is a heterocyclic group which is unsubstituted or substituted with one or two or more substituents selected from the group consisting of an aryl group and a heterocyclic group.

In another exemplary embodiment, Ar is a quinoline group.

In an exemplary embodiment of the present specification, Ar is a heterocyclic group which is unsubstituted or substituted with an aryl group.

In another exemplary embodiment, Ar is a heterocyclic group which is unsubstituted or substituted with a phenyl group.

In still another exemplary embodiment, Ar is a pyrimidine group which is substituted with a phenyl group.

In an exemplary embodiment of the present specification, Ar is a pyridine group which is substituted with a phenyl group.

In another exemplary embodiment, Ar is a triazine group which is substituted with a phenyl group.

In another exemplary embodiment of the present specification, Ar is a pyridine group.

In still another exemplary embodiment of the present specification, Ar is a carbazole group.

In one exemplary embodiment of the present specification, Ar is an aryl group which is unsubstituted or substituted with one or two or more substituents selected from the group consisting of an aryl group and a heterocyclic group.

In an exemplary embodiment of the present specification, Ar is a phenyl group.

In another exemplary embodiment of the present specification, Ar is an aryl group which is substituted with an aryl group.

In still another exemplary embodiment, Ar is an aryl group which is substituted with a phenyl group.

In another exemplary embodiment, Ar is a fluorenyl group which is substituted with a phenyl group.

In an exemplary embodiment of the present specification, Ar1 to Ar3 are the same as or different from each other, and are each independently a substituted or unsubstituted phenyl group; a substituted or unsubstituted biphenyl group; a substituted or unsubstituted naphthyl group; or a substituted or unsubstituted fluorenyl group.

In an exemplary embodiment of the present specification, Ar1 to Ar3 are the same as or different from each other, and are each independently phenyl; biphenyl; naphthalene; phenyl-naphthalene-phenyl-quinoline; phenyl-naphthalene-phenyl-pyrimidine-phenyl; phenyl-naphthalene-phenyl-pyridine-phenyl; phenyl-naphthalene-phenyl-pyrimidine; fluorene-phenyl; phenyl-terphenyl; biphenyl-phenyl; naphthyl-fluorenene-phenyl; phenyl-fluorene-phenyl; biphenyl-carbazole; or phenyl-naphthalene-phenyl-triazine-phenyl.

In an exemplary embodiment of the present specification, the "-naphthalene-" is 2,7-naphthalene or 1,4-naphthalene.

In an exemplary embodiment of the present specification, an organic compound containing the aromatic heterocyclic compound represented by Formula 2 is represented by any one of the following Formulae 2-1 to 2-13.

[Formula 2-1]

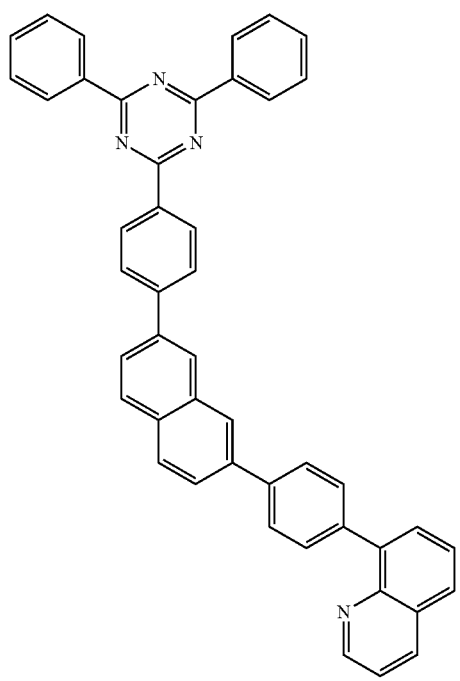

[Formula 2-2]

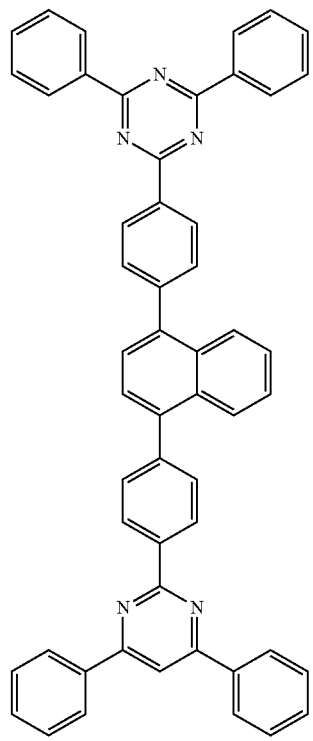

[Formula 2-3]

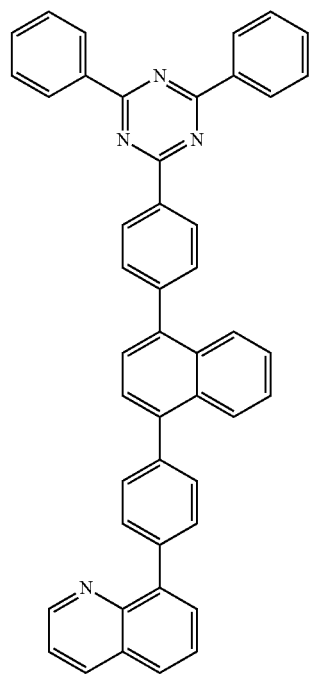

[Formula 2-4]
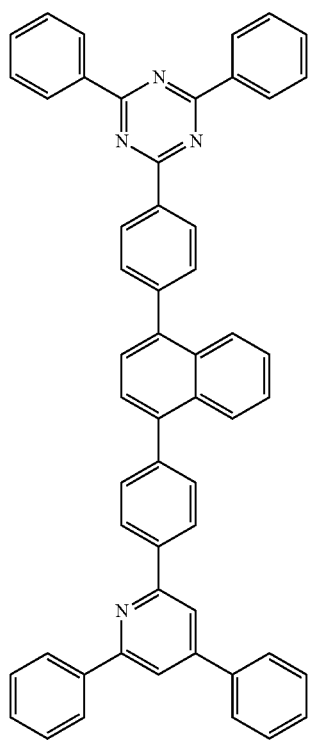
[Formula 2-5]
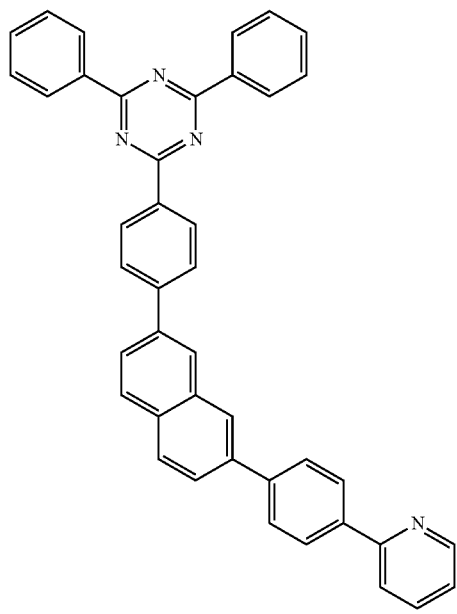
[Formula 2-6]
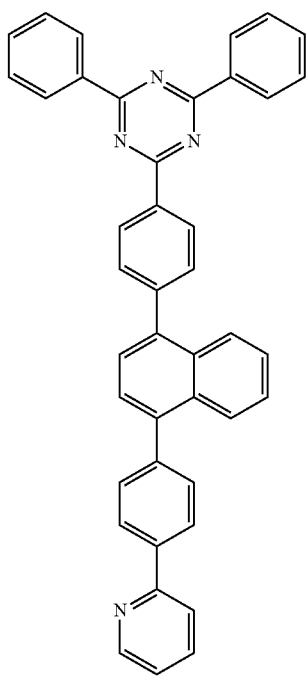
[Formula 2-7]
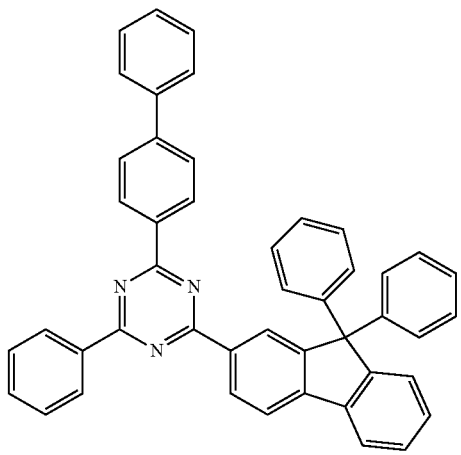

[Formula 2-8]
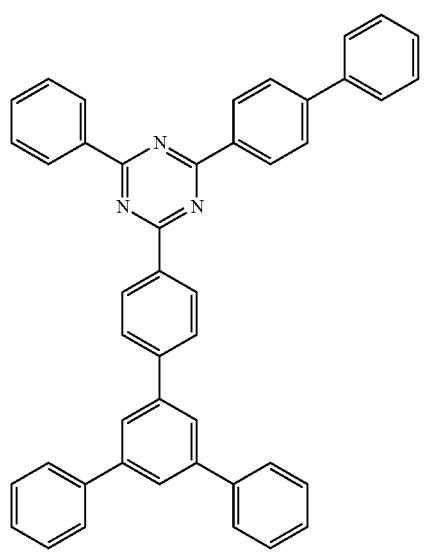
[Formula 2-9]
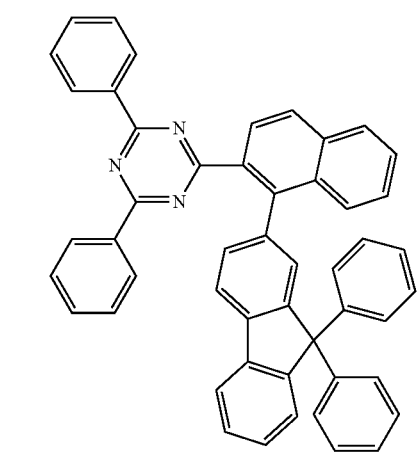
[Formula 2-10]
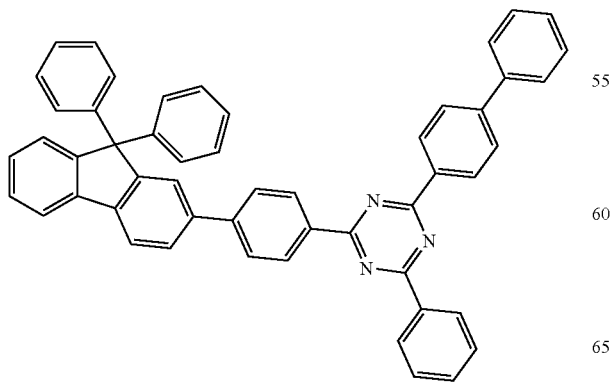
[Formula 2-11]
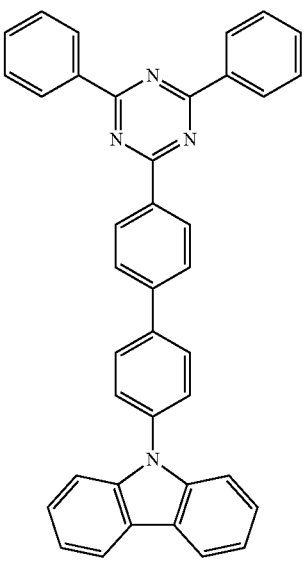
[Formula 2-12]
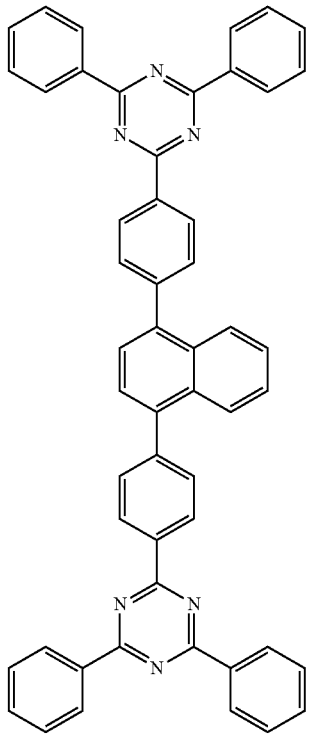

-continued

[Formula 2-13]

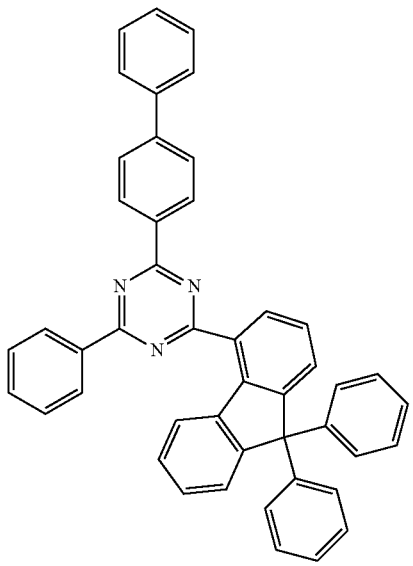

Examples of the substituents will be described below, but are not limited thereto.

The term "substitution" means that a hydrogen atom bonded to a carbon atom of a compound is changed into another substituent, and a position to be substituted is not limited as long as the position is a position at which the hydrogen atom is substituted, that is, a position at which the substituent may be substituted, and when two or more are substituted, the two or more substituents may be the same as or different from each other.

In the present specification, the term "substituted or unsubstituted" means that a group is substituted with one or two or more substituents selected from the group consisting of deuterium; a halogen group; a nitrile group; a nitro group; an imide group; an amide group; a hydroxy group; a substituted or unsubstituted alkyl group; a substituted or unsubstituted cycloalkyl group; a substituted or unsubstituted alkoxy group; a substituted or unsubstituted alkenyl group; a substituted or unsubstituted amine group; a substituted or unsubstituted aryl group; and a substituted or unsubstituted heterocyclic group or is substituted with a substituent to which two or more substituents are linked among the substituents exemplified above, or has no substituent. For example, "the substituent to which two or more substituents are linked" may be a biphenyl group. That is, the biphenyl group may also be an aryl group, and may be interpreted as a substituent to which two phenyl groups are linked.

In the present specification,

means a moiety bonded to another substituent or a binding portion.

When the aryl group is a monocyclic aryl group, the number of carbon atoms thereof is not particularly limited, but is preferably 6 to 25. Specific examples of the monocyclic aryl group include a phenyl group, a biphenyl group, a terphenyl group, and the like, but are not limited thereto.

When the aryl group is a polycyclic aryl group, the number of carbon atoms thereof is not particularly limited, but is preferably 10 to 24. Specific examples of the polycyclic aryl group include a naphthyl group, an anthracenyl group, a phenanthryl group, a pyrenyl group, a perylenyl group, a chrysenyl group, a fluorenyl group, and the like, but are not limited thereto.

In the present specification, the fluorenyl group may be substituted, and adjacent substituents may combine with each other to form a ring.

When the fluorenyl group is substituted, the substituent may be

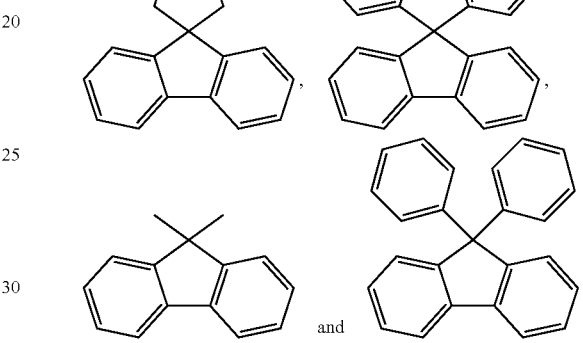

However, the fluorenyl group is not limited thereto.

In the present specification, the heterocyclic group includes one or more of an atom other than carbon, and a heteroatom, and specifically, the heteroatom may include one or more atoms selected from the group consisting of O, N, Se, S, and the like. The number of carbon atoms is not particularly limited, but is preferably 2 to 60. Examples of the heterocyclic group include a thiophene group, a furan group, a pyrrole group, an imidazole group, a triazole group, an oxazole group, an oxadiazole group, a pyridyl group, a bipyridyl group, a pyrimidyl group, a triazine group, a triazole group, an acridyl group, a pyridazine group, a pyrazinyl group, a qinolinyl group, a quinazoline group, a quinoxalinyl group, a phthalazinyl group, a pyridopyrimidinyl group, a pyridopyrazinyl group, a pyrazinopyrazinyl group, an isoquinoline group, an indole group, a carbazole group, a benzoxazole group, a benzimidazole group, a benzothiazole group, a benzocarbazole group, a benzothiophene group, a dibenzothiophene group, a benzofuranyl group, a phenanthroline group, a thiazolyl group, an isoxazolyl group, an oxadiazolyl group, a thiadiazolyl group, a benzothiazolyl group, a phenothiazinyl group, a dibenzofuranyl group, and the like, but are not limited thereto.

The heterocyclic group may be monocyclic or polycyclic, and may be an aromatic ring, an aliphatic ring, or a condensed ring of the aromatic ring and the aliphatic ring.

In the present specification, the "adjacent" group may mean a substituent substituted with an atom directly linked to an atom in which the corresponding substituent is substituted, a substituent disposed sterically closest to the corresponding substituent, or another substituent substituted with an atom in which the corresponding substituent is substituted. For example, two substituents substituted at the ortho position in a benzene ring and two substituents substituted with the same carbon in an aliphatic ring may be interpreted as groups which are "adjacent" to each other.

In the present specification, that adjacent groups combine with each other to form a hydrocarbon ring or a hetero ring means that adjacent substituents form a bond to form 5- to 7-membered monocyclic or polycyclic hydrocarbon rings or 5- to 7-membered monocyclic or polycyclic heterocyclic groups.

In the present specification, the hydrocarbon ring includes all of a cycloalkyl group; a cycloalkenyl group; an aromatic ring group; or an aliphatic ring group, may be monocyclic or polycyclic, and includes all of the rings condensed by combining one or two or more of these groups.

The heterocyclic group formed in the present specification means those in which at least one carbon atom of the hydrocarbon rings is substituted with N, O, or S atom, may be an aliphatic ring or aromatic ring, and may be monocyclic or polycyclic.

The organic light emitting diode of the present specification may be manufactured by materials and methods known in the art, except for including an electron transporting layer and an electron adjusting layer.

For example, the organic light emitting diode of the present specification may be manufactured by sequentially stacking an anode, an organic material layer, and a cathode on a substrate. In this case, the organic light emitting diode may be manufactured by depositing a metal or a metal oxide having conductivity, or an alloy thereof on a substrate to form an anode by using a physical vapor deposition (PVD) method such as sputtering or e-beam evaporation, forming an organic material layer including a hole injection layer, a hole transporting layer, a light emitting layer, an electron adjusting layer, and an electron transporting layer thereon, and then depositing a material, which may be used as a cathode, thereon. In addition to the method described above, an organic light emitting diode may be made by subsequently depositing a cathode material, an organic material layer, and an anode material on a substrate.

The organic material layer of the organic light emitting diode of the present specification may be composed of a multi-layered structure in which two or more organic material layers are stacked.

In an exemplary embodiment of the present specification, the organic light emitting diode may further include one or two or more layers selected from the group consisting of a hole injection layer, a hole transporting layer, an electron transporting layer, an electron injection layer, an electron blocking layer, and a hole blocking layer.

For example, the structure of the organic light emitting diode of the present specification may have a structure as illustrated in FIG. 1, but is not limited thereto.

FIG. 1 illustrates the structure of an organic light emitting diode in which an anode 201, a light emitting layer 301, an electron adjusting layer 401, an electron transporting layer 501, and a cathode 601 are sequentially stacked on a substrate 101. FIG. 1 is an exemplified structure according to exemplary embodiments of the present specification, and may further include other organic material layers.

When the organic light emitting diode includes a plurality of organic material layers, the organic material layer may be formed of the same material or different materials.

As the anode material, a material having a large work function is usually preferred so as to smoothly inject holes into an organic material layer. Specific examples of the positive electrode material which may be used in the present invention include: a metal, such as vanadium, chromium, copper, zinc, and gold, or alloys thereof; a metal oxide, such as zinc oxide, indium oxide, indium tin oxide (ITO), and indium zinc oxide (IZO); a combination of metal and oxide, such as ZnO:Al or $SnO_2$:Sb; an electrically conductive polymer, such as poly(3-methylthiophene), poly[3,4-(ethylene-1,2-dioxy)thiophene] (PEDOT), polypyrrole, and polyaniline, and the like, but are not limited thereto.

As the cathode material, a material having a small work function is usually preferred so as to smoothly inject electrons into an organic material layer. Specific examples of the negative electrode material include: a metal, such as magnesium, calcium, sodium, potassium, titanium, indium, yttrium, lithium, gadolinium, aluminum, silver, tin, and lead, or alloys thereof; a multi-layered structural material, such as LiF/Al or $LiO_2$/Al, and the like, but are not limited thereto.

The hole injection material is a layer which injects holes from an electrode, and is preferably a compound which has a capability of transporting holes, and thus has an effect of injecting holes at a positive electrode and an excellent effect of injecting holes for the light emitting layer or the light emitting material, prevents excitons produced from the light emitting layer from moving to an electron injection layer or an electron injection material, and is excellent in forming a thin film. It is preferred that the highest occupied molecular orbital (HOMO) of the hole injection material is between the work function of the positive electrode material and the HOMO of an adjacent organic material layer. Specific examples of the hole injection material include metal porphyrin, oligothiophene, an arylamine-based organic material, a hexanitrile hexaazatriphenylene-based organic material, a quinacridone-based organic material, a perylene-based organic material, anthraquinone, a polyaniline and polythiophene-based electrically conductive polymer, and the like, but are not limited thereto.

The hole transporting layer is a layer which receives holes from the hole injection layer and transports holes to the light emitting layer, and a hole transporting material is suitably a material which may receive holes from a positive electrode or a hole injection layer to transfer holes to a light emitting layer, and has a large mobility for the holes. Specific examples thereof include an arylamine-based organic material, an electrically conductive polymer, a block copolymer in which a conjugate portion and a non-conjugate portion are present together, and the like, but are not limited thereto.

The light emitting material is a material which may receive holes and electrons from the hole transporting layer and the electron transporting layer, respectively, and combine the holes and the electrons to emit light in a visible ray region, and is preferably a material having good quantum efficiency to fluorescence or phosphorescence. Specific examples thereof include: a 8-hydroxy-quinoline aluminum complex ($Alq_3$); a carbazole-based compound; a dimerized styryl compound; BAlq; a 10-hydroxybenzoquinoline-metal compound; a benzoxazole, benzthiazole and benzimidazole-based compound; a poly(p-phenylenevinylene (PPV)-based polymer; a spiro compound; polyfluorene, lubrene, and the like, but are not limited thereto.

The light emitting layer may include a host material and a dopant material. Examples of the host material include a condensed aromatic ring derivative, or a hetero ring-containing compound, and the like. Specifically, examples of the condensed aromatic ring derivative include an anthracene derivative, a pyrene derivative, a naphthalene derivative, a pentacene derivative, a phenanthrene compound, a fluoranthene compound, and the like, and examples of the hetero ring-containing compound include a carbazole derivative, a dibenzofuran derivative, a ladder-type furan compound, a pyrimidine derivative, and the like, but the examples thereof are not limited thereto. Examples of the dopant material include an organic compound, a metal, or a metal compound.

Examples of the organic compound as the dopant material include an aromatic amine derivative, a styrylamine compound, a boron complex, a fluoranthene compound, and the like. Specifically, the aromatic amine derivative is a condensed aromatic ring derivative having a substituted or unsubstituted arylamino group, and examples thereof include a pyrene, an anthracene, a chrysene, a periflanthene, and the like having an arylamino group, and the styrylamine compound is a compound in which a substituted or unsubstituted arylamine is substituted with at least one arylvinyl group, and one or two or more substituents selected from the group consisting of an aryl group, a silyl group, an alkyl group, a cycloalkyl group, and an arylamino group are substituted or unsubstituted. Specific examples thereof include styrylamine, styryldiamine, styryltriamine, styryltetramine, and the like, but are not limited thereto. In addition, as the metal or the metal compound, typical metal or metal compound may be used, and specifically, a metal complex may be used. Examples of the metal complex include an iridium complex, a platinum complex, and the like, but are not limited thereto.

The electron injection layer is a layer which injects electrons from an electrode, and is preferably a compound which has a capability of transporting electrons, has an effect of injecting electrons from a neg and an excellent effect of injecting electrons into a light emitting layer or a light emitting material, prevents excitons produced from the light emitting layer from moving to the hole injection layer, and is also excellent in the ability to form a thin film. Specific examples thereof include fluorenone, anthraquinodimethane, diphenoquinone, thiopyran dioxide, oxazole, oxadiazole, triazole, imidazole, perylenetetracarboxylic acid, fluorenylidene methane, anthrone and derivatives thereof, a metal complex compound, a nitrogen-containing 5-membered derivative, and the like, but are not limited thereto.

Examples of the metal complex compound include 8-hydroxyquinolinato lithium, bis(8-hydroxyquinolinato) zinc, bis(8-hydroxyquinolinato) copper, bis(8-hydroxyquinolinato) manganese, tris(8-hydroxyquinolinato) aluminum, tris (2-methyl-8-hydroxyquinolinato) aluminum, tris(8-hydroxyquinolinato) gallium, bis(10-hydroxybenzo[h] quinolinato) beryllium, bis(10-hydroxybenzo[h] quinolinato) zinc, bis(2-methyl-8-quinolinato) chlorogallium, bis(2-methyl-8-quinolinato) (o-cresolato) gallium, bis(2-methyl-8-quinolinato) (1-naphtholato) aluminum, bis(2-methyl-8-quinolinato) (2-naphtholato) gallium, and the like, but are not limited thereto.

The hole blocking layer is a layer which blocks holes from reaching a negative electrode, and may be generally formed under the same conditions as those of the hole injection layer. Specific examples thereof include an oxadiazole derivative or a triazole derivative, a phenanthroline derivative, BCP, an aluminum complex, and the like, but are not limited thereto.

The organic light emitting diode according to the present specification may be a top emission type, a bottom emission type, or a dual emission type according to the material to be used.

In addition, the organic light emitting diode according to the present specification may be a normal type in which a lower electrode is an anode and an upper electrode is a cathode, and may also be an inverted type in which a lower electrode is a cathode and an upper electrode is an anode.

The structure according to an exemplary embodiment of the present specification may be operated by a principle which is similar to the principle applied to an organic light emitting diode, even in an organic electronic diode including an organic solar cell, an organic photoconductor, an organic transistor, and the like.

MODE FOR INVENTION

Hereinafter, the present specification will be described in detail with reference to Examples for specifically describing the present specification. However, the Examples according to the present specification may be modified in various forms, and it is not interpreted that the scope of the present specification is not limited to the Examples described below in detail. The Examples of the present specification are provided for more completely explaining the present specification to the person with ordinary skill in the art.

Example 1

Manufacture of Organic Light Emitting Diode

A glass substrate (Corgning 7059 glass) thinly coated with indium tin oxide (ITO) to have a thickness of 1,000 Å was put into distilled water in which a detergent was dissolved, and ultrasonically washed. In this case, a product manufactured by Fischer Co., was used as the detergent, and distilled water twice filtered using a filter manufactured by Millipore Co., was used as the distilled water. After the ITO was washed for 30 minutes, ultrasonic washing was conducted twice using distilled water for 10 minutes. After the washing using distilled water was completed, ultrasonic washing was conducted using a solvent such as isopropyl alcohol, acetone, and methanol, and drying was conducted, and then the product was transferred to a plasma washing machine. In addition, the substrate was dry washed using oxygen plasma for 5 minutes, and then transferred to a vacuum evaporator.

The compound of the following Formula hexanitrilehexaazatriphenylene (hereinafter, referred to as HAT) was thermally vacuum deposited to a thickness of 500 Å on the transparent ITO electrode, which was prepared as described above, thereby forming a thin film. Interfacial characteristics between the substrate and the hole injection layer may be improved by the thin film. Subsequently, a compound of the following Formula HT-1 was deposited to have a thickness of 400 Å on the thin film, thereby forming a hole transporting layer, and a compound of the following EB-1 was deposited to have a thickness of 250 Å thereon, thereby forming an electron blocking layer. A compound of the following H1 as a host and a compound of the following D1 as a dopant in the light emitting layer were vacuum deposited to have a thickness of 200 Å thereon. Compound 1-1-1 was deposited to have a thickness of 100 Å on the light emitting layer, thereby forming an electron adjusting layer, and the electron transporting layer material of Compound 2-1 and lithium quinolate (LiQ) were vacuum deposited at a weight ratio of 1:1 thereon, thereby forming an electron injection and transporting layer having a thickness of 300 Å. Lithium fluoride (LiF) and aluminum were subsequently deposited to have a thickness of 12 Å and 2,000 Å, respectively, on the electron transporting layer, thereby forming a negative electrode.

In the aforementioned process, the deposition rate of the organic material was maintained at 0.3 to 0.8 Å/sec. Furthermore, the deposition rates of lithium fluoride and aluminum in the negative electrode were maintained at 0.3

Å/sec and 1.5 to 2.5 Å/sec, respectively. The degree of vacuum during the deposition was maintained at 1 to 3×10⁻⁷.
[HAT]
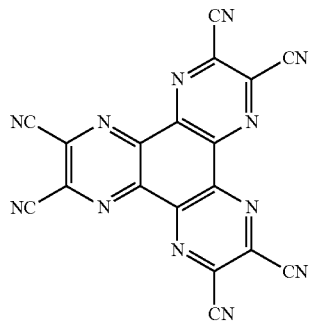
[LiQ]
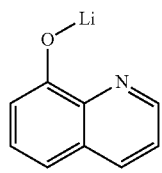
[H1]
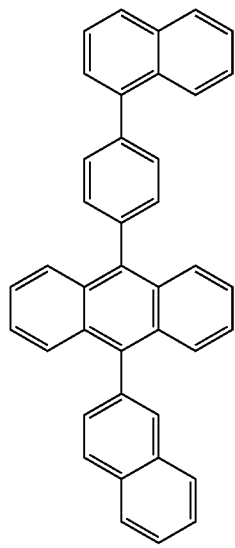
-continued
[D1]
[HT-1]
[EB-1]
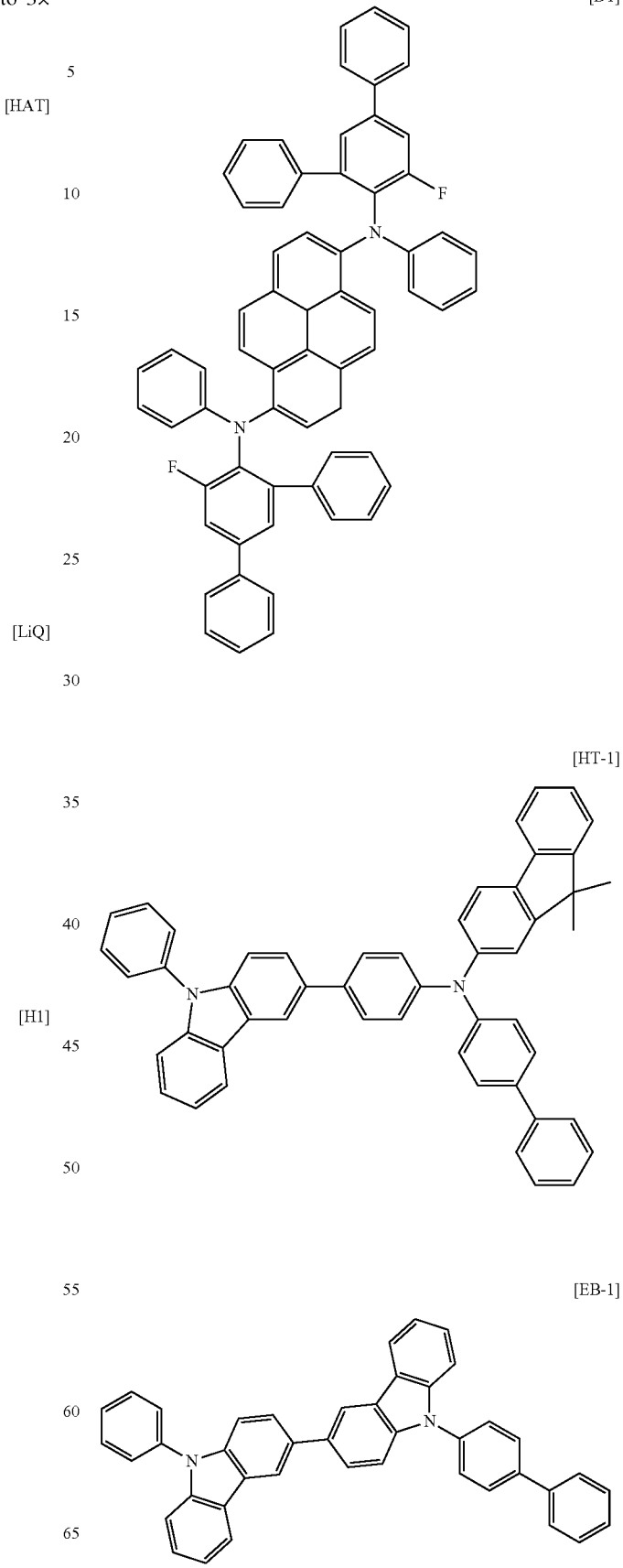

Example 2

Manufacture of Organic Light Emitting Diode

An organic light emitting diode was manufactured in the same manner as in Example 1, except that Compound 2-3 was used instead of Compound 2-1 in Example 1.

Example 3

Manufacture of Organic Light Emitting Diode

An organic light emitting diode was manufactured in the same manner as in Example 1, except that Compound 2-4 was used instead of Compound 2-1 in Example 1.

Example 4

Manufacture of Organic Light Emitting Diode

An organic light emitting diode was manufactured in the same manner as in Example 1, except that Compound 2-7 was used instead of Compound 2-1 in Example 1.

Example 5

Manufacture of Organic Light Emitting Diode

An organic light emitting diode was manufactured in the same manner as in Example 1, except that Compound 2-8 was used instead of Compound 2-1 in Example 1.

Example 6

Manufacture of Organic Light Emitting Diode

An organic light emitting diode was manufactured in the same manner as in Example 1, except that Compound 2-13 was used instead of Compound 2-1 in Example 1.

Example 7

Manufacture of Organic Light Emitting Diode

An organic light emitting diode was manufactured in the same manner as in Example 1, except that Compound 1-2-3 was used instead of Compound 1-1-1 in Example 1.

Example 8

Manufacture of Organic Light Emitting Diode

An organic light emitting diode was manufactured in the same manner as in Example 1, except that Compound 1-2-10 was used instead of Compound 1-1-1 in Example 1.

Example 9

Manufacture of Organic Light Emitting Diode

An organic light emitting diode was manufactured in the same manner as in Example 1, except that Compound 1-3-1 was used instead of Compound 1-1-1 in Example 1.

Example 10

Manufacture of Organic Light Emitting Diode

An organic light emitting diode was manufactured in the same manner as in Example 1, except that Compound 1-3-2 was used instead of Compound 1-1-1 in Example 1.

Example 11

Manufacture of Organic Light Emitting Diode

An organic light emitting diode was manufactured in the same manner as in Example 1, except that Compound 1-4-1 was used instead of Compound 1-1-1 in Example 1.

Example 12

Manufacture of Organic Light Emitting Diode

An organic light emitting diode was manufactured in the same manner as in Example 2, except that Compound 1-2-3 was used instead of Compound 1-1-1 in Example 2.

Example 13

Manufacture of Organic Light Emitting Diode

An organic light emitting diode was manufactured in the same manner as in Example 2, except that Compound 1-2-10 was used instead of Compound 1-1-1 in Example 2.

Example 14

Manufacture of Organic Light Emitting Diode

An organic light emitting diode was manufactured in the same manner as in Example 2, except that Compound 1-3-1 was used instead of Compound 1-1-1 in Example 2.

Example 15

Manufacture of Organic Light Emitting Diode

An organic light emitting diode was manufactured in the same manner as in Example 2, except that Compound 1-3-2 was used instead of Compound 1-1-1 in Example 2.

Example 16

Manufacture of Organic Light Emitting Diode

An organic light emitting diode was manufactured in the same manner as in Example 2, except that Compound 1-4-1 was used instead of Compound 1-1-1 in Example 2.

Example 17

Manufacture of Organic Light Emitting Diode

An organic light emitting diode was manufactured in the same manner as in Example 3, except that Compound 1-2-3 was used instead of Compound 1-1-1 in Example 3.

Example 18

Manufacture of Organic Light Emitting Diode

An organic light emitting diode was manufactured in the same manner as in Example 3, except that Compound 1-2-10 was used instead of Compound 1-1-1 in Example 3.

Example 19

Manufacture of Organic Light Emitting Diode

An organic light emitting diode was manufactured in the same manner as in Example 3, except that Compound 1-3-1 was used instead of Compound 1-1-1 in Example 3.

Example 20

Manufacture of Organic Light Emitting Diode

An organic light emitting diode was manufactured in the same manner as in Example 3, except that Compound 1-3-2 was used instead of Compound 1-1-1 in Example 3.

Example 21

Manufacture of Organic Light Emitting Diode

An organic light emitting diode was manufactured in the same manner as in Example 3, except that Compound 1-4-1 was used instead of Compound 1-1-1 in Example 3.

Example 22

Manufacture of Organic Light Emitting Diode

An organic light emitting diode was manufactured in the same manner as in Example 4, except that Compound 1-2-3 was used instead of Compound 1-1-1 in Example 4.

Example 23

Manufacture of Organic Light Emitting Diode

An organic light emitting diode was manufactured in the same manner as in Example 4, except that Compound 1-2-10 was used instead of Compound 1-1-1 in Example 4.

Example 24

Manufacture of Organic Light Emitting Diode

An organic light emitting diode was manufactured in the same manner as in Example 4, except that Compound 1-3-1 was used instead of Compound 1-1-1 in Example 4.

Example 25

Manufacture of Organic Light Emitting Diode

An organic light emitting diode was manufactured in the same manner as in Example 4, except that Compound 1-3-2 was used instead of Compound 1-1-1 in Example 4.

Example 26

Manufacture of Organic Light Emitting Diode

An organic light emitting diode was manufactured in the same manner as in Example 4, except that Compound 1-4-1 was used instead of Compound 1-1-1 in Example 4.

Example 27

Manufacture of Organic Light Emitting Diode

An organic light emitting diode was manufactured in the same manner as in Example 5, except that Compound 1-2-3 was used instead of Compound 1-1-1 in Example 5.

Example 28

Manufacture of Organic Light Emitting Diode

An organic light emitting diode was manufactured in the same manner as in Example 5, except that Compound 1-2-10 was used instead of Compound 1-1-1 in Example 5.

Example 29

Manufacture of Organic Light Emitting Diode

An organic light emitting diode was manufactured in the same manner as in Example 5, except that Compound 1-3-1 was used instead of Compound 1-1-1 in Example 5.

Example 30

Manufacture of Organic Light Emitting Diode

An organic light emitting diode was manufactured in the same manner as in Example 5, except that Compound 1-3-2 was used instead of Compound 1-1-1 in Example 5.

Example 31

Manufacture of Organic Light Emitting Diode

An organic light emitting diode was manufactured in the same manner as in Example 5, except that Compound 1-4-1 was used instead of Compound 1-1-1 in Example 5.

Example 32

Manufacture of Organic Light Emitting Diode

An organic light emitting diode was manufactured in the same manner as in Example 6, except that Compound 1-2-3 was used instead of Compound 1-1-1 in Example 6.

Example 33

Manufacture of Organic Light Emitting Diode

An organic light emitting diode was manufactured in the same manner as in Example 6, except that Compound 1-2-10 was used instead of Compound 1-1-1 in Example 6.

Example 34

Manufacture of Organic Light Emitting Diode

An organic light emitting diode was manufactured in the same manner as in Example 6, except that Compound 1-3-1 was used instead of Compound 1-1-1 in Example 6.

Example 35

Manufacture of Organic Light Emitting Diode

An organic light emitting diode was manufactured in the same manner as in Example 6, except that Compound 1-3-2 was used instead of Compound 1-1-1 in Example 6.

Example 36

Manufacture of Organic Light Emitting Diode

An organic light emitting diode was manufactured in the same manner as in Example 6, except that Compound 1-4-1 was used instead of Compound 1-1-1 in Example 6.

Comparative Example 1

Manufacture of Organic Light Emitting Diode

An organic light emitting diode was manufactured in the same manner as in Example 1, except that the following Formula ET-1 was used instead of Compound 1-1-1 in Example 1.

[Formula ET-1]

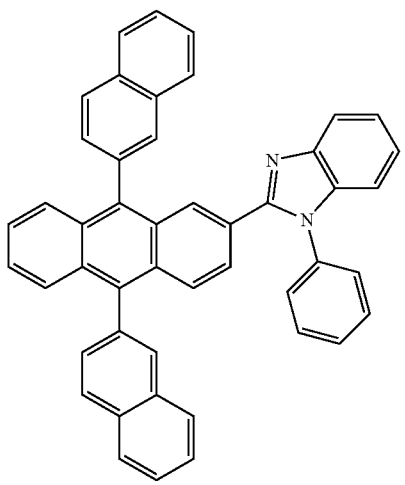

Comparative Example 2

Manufacture of Organic Light Emitting Diode

An organic light emitting diode was manufactured in the same manner as in Example 2, except that the following Formula ET-1 was used instead of Compound 1-1-1 in Example 2.

Comparative Example 3

Manufacture of Organic Light Emitting Diode

An organic light emitting diode was manufactured in the same manner as in Example 3, except that the following Formula ET-1 was used instead of Compound 1-1-1 in Example 3.

Comparative Example 4

Manufacture of Organic Light Emitting Diode

An organic light emitting diode was manufactured in the same manner as in Example 4, except that the following Formula ET-1 was used instead of Compound 1-1-1 in Example 4.

Comparative Example 5

Manufacture of Organic Light Emitting Diode

An organic light emitting diode was manufactured in the same manner as in Example 5, except that the following Formula ET-1 was used instead of Compound 1-1-1 in Example 5.

Comparative Example 6

Manufacture of Organic Light Emitting Diode

An organic light emitting diode was manufactured in the same manner as in Example 6, except that the following Formula ET-1 was used instead of Compound 1-1-1 in Example 6.

Comparative Example 7

Manufacture of Organic Light Emitting Diode

An organic light emitting diode was manufactured in the same manner as in Example 1, except that the following Formula ET-2 was used instead of Compound 1-1-1 in Example 1.

[Formula ET-2]

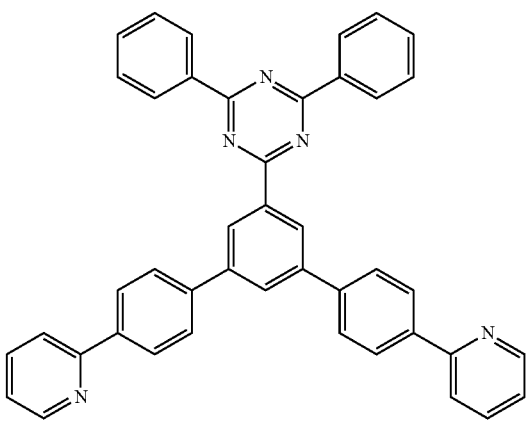

Comparative Example 8

Manufacture of Organic Light Emitting Diode

An organic light emitting diode was manufactured in the same manner as in Example 2, except that the following Formula ET-2 was used instead of Compound 1-1-1 in Example 2.

Comparative Example 9

Manufacture of Organic Light Emitting Diode

An organic light emitting diode was manufactured in the same manner as in Example 3, except that the following Formula ET-2 was used instead of Compound 1-1-1 in Example 3.

Comparative Example 10

Manufacture of Organic Light Emitting Diode

An organic light emitting diode was manufactured in the same manner as in Example 4, except that the following Formula ET-2 was used instead of Compound 1-1-1 in Example 4.

Comparative Example 11

Manufacture of Organic Light Emitting Diode

An organic light emitting diode was manufactured in the same manner as in Example 5, except that the following Formula ET-2 was used instead of Compound 1-1-1 in Example 5.

Comparative Example 12

Manufacture of Organic Light Emitting Diode

An organic light emitting diode was manufactured in the same manner as in Example 6, except that the following Formula ET-2 was used instead of Compound 1-1-1 in Example 6.

Comparative Example 13

Manufacture of Organic Light Emitting Diode

An organic light emitting diode was manufactured in the same manner as in Example 1, except that the following Formula ET-3 was used instead of Compound 1-1-1 in Example 1.

Comparative Example 14

Manufacture of Organic Light Emitting Diode

An organic light emitting diode was manufactured in the same manner as in Example 2, except that the following Formula ET-3 was used instead of Compound 1-1-1 in Example 2.

Comparative Example 15

Manufacture of Organic Light Emitting Diode

An organic light emitting diode was manufactured in the same manner as in Example 3, except that the following Formula ET-3 was used instead of Compound 1-1-1 in Example 3.

Comparative Example 16

Manufacture of Organic Light Emitting Diode

An organic light emitting diode was manufactured in the same manner as in Example 4, except that the following Formula ET-3 was used instead of Compound 1-1-1 in Example 4.

Comparative Example 17

Manufacture of Organic Light Emitting Diode

An organic light emitting diode was manufactured in the same manner as in Example 5, except that the following Formula ET-3 was used instead of Compound 1-1-1 in Example 5.

Comparative Example 18

Manufacture of Organic Light Emitting Diode

An organic light emitting diode was manufactured in the same manner as in Example 6, except that the following Formula ET-3 was used instead of Compound 1-1-1 in Example 6.

Comparative Example 19

Manufacture of Organic Light Emitting Diode

The electron transporting layer material of Compound 2-1 and lithium quinolate (LiQ) were vacuum deposited at a weight ratio of 1:1 on the light emitting layer in Example 1, thereby forming an electron injection and transporting layer having a thickness of 400 Å.

Comparative Example 20

Manufacture of Organic Light Emitting Diode

An organic light emitting diode was manufactured in the same manner as in Comparative Example 19, except that Compound 2-3 was used instead of Compound 2-1 in Comparative Example 19.

[Formula ET-3]

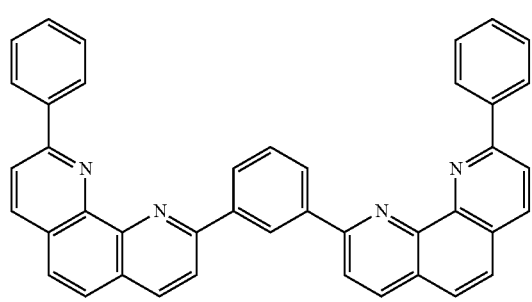

Comparative Example 21

Manufacture of Organic Light Emitting Diode

An organic light emitting diode was manufactured in the same manner as in Comparative Example 19, except that Compound 2-4 was used instead of Compound 2-1 in Comparative Example 19.

Comparative Example 22

Manufacture of Organic Light Emitting Diode

An organic light emitting diode was manufactured in the same manner as in Comparative Example 19, except that Compound 2-7 was used instead of Compound 2-1 in Comparative Example 19.

Comparative Example 23

Manufacture of Organic Light Emitting Diode

An organic light emitting diode was manufactured in the same manner as in Comparative Example 19, except that Compound 2-8 was used instead of Compound 2-1 in Comparative Example 19.

Comparative Example 24

Manufacture of Organic Light Emitting Diode

An organic light emitting diode was manufactured in the same manner as in Comparative Example 19, except that Compound 2-13 was used instead of Compound 2-1 in Comparative Example 19.

Comparative Example 25

Manufacture of Organic Light Emitting Diode

Compound 1-1-1 was deposited to have a thickness of 300 Å on the light emitting layer in Example 1, thereby forming an electron adjusting layer, and the electron transporting material of Compound 2-1 and lithium quinolate (LiQ) were vacuum deposited at a weight ratio of 1:1 thereon, thereby forming an electron injection and transporting layer having a thickness of 100 Å.

Comparative Example 26

Manufacture of Organic Light Emitting Diode

An organic light emitting diode was manufactured in the same manner as in Comparative Example 25, except that Compound 2-3 was used instead of Compound 2-1 in Comparative Example 25.

Comparative Example 27

Manufacture of Organic Light Emitting Diode

An organic light emitting diode was manufactured in the same manner as in Comparative Example 25, except that Compound 2-4 was used instead of Compound 2-1 in Comparative Example 25.

Comparative Example 28

Manufacture of Organic Light Emitting Diode

An organic light emitting diode was manufactured in the same manner as in Comparative Example 25, except that Compound 2-7 was used instead of Compound 2-1 in Comparative Example 25.

Comparative Example 29

Manufacture of Organic Light Emitting Diode

An organic light emitting diode was manufactured in the same manner as in Comparative Example 25, except that Compound 2-8 was used instead of Compound 2-1 in Comparative Example 25.

Comparative Example 30

Manufacture of Organic Light Emitting Diode

An organic light emitting diode was manufactured in the same manner as in Comparative Example 25, except that Compound 2-13 was used instead of Compound 2-1 in Comparative Example 25.

Comparative Example 31

Manufacture of Organic Light Emitting Diode

An organic light emitting diode was manufactured in the same manner as in Comparative Example 25, except that Compound 1-2-3 was used instead of Compound 1-1-1 in Comparative Example 25.

Comparative Example 32

Manufacture of Organic Light Emitting Diode

An organic light emitting diode was manufactured in the same manner as in Comparative Example 25, except that Compound 1-2-10 was used instead of Compound 1-1-1 in Comparative Example 25.

Comparative Example 33

Manufacture of Organic Light Emitting Diode

An organic light emitting diode was manufactured in the same manner as in Comparative Example 25, except that Compound 1-3-1 was used instead of Compound 1-1-1 in Comparative Example 25.

Comparative Example 34

Manufacture of Organic Light Emitting Diode

An organic light emitting diode was manufactured in the same manner as in Comparative Example 25, except that Compound 1-3-2 was used instead of Compound 1-1-1 in Comparative Example 25.

Comparative Example 35

Manufacture of Organic Light Emitting Diode

An organic light emitting diode was manufactured in the same manner as in Comparative Example 25, except that Compound 1-4-1 was used instead of Compound 1-1-1 in Comparative Example 25.

Comparative Example 36

Manufacture of Organic Light Emitting Diode

An organic light emitting diode was manufactured in the same manner as in Comparative Example 26, except that Compound 1-2-3 was used instead of Compound 1-1-1 in Comparative Example 26.

Comparative Example 37

Manufacture of Organic Light Emitting Diode

An organic light emitting diode was manufactured in the same manner as in Comparative Example 26, except that Compound 1-2-10 was used instead of Compound 1-1-1 in Comparative Example 26.

Comparative Example 38

Manufacture of Organic Light Emitting Diode

An organic light emitting diode was manufactured in the same manner as in Comparative Example 26, except that Compound 1-3-1 was used instead of Compound 1-1-1 in Comparative Example 26.

Comparative Example 39

Manufacture of Organic Light Emitting Diode

An organic light emitting diode was manufactured in the same manner as in Comparative Example 26, except that Compound 1-3-2 was used instead of Compound 1-1-1 in Comparative Example 26.

Comparative Example 40

Manufacture of Organic Light Emitting Diode

An organic light emitting diode was manufactured in the same manner as in Comparative Example 26, except that Compound 1-4-1 was used instead of Compound 1-1-1 in Comparative Example 26.

Comparative Example 41

Manufacture of Organic Light Emitting Diode

An organic light emitting diode was manufactured in the same manner as in Comparative Example 27, except that Compound 1-2-3 was used instead of Compound 1-1-1 in Comparative Example 27.

Comparative Example 42

Manufacture of Organic Light Emitting Diode

An organic light emitting diode was manufactured in the same manner as in Comparative Example 27, except that Compound 1-2-10 was used instead of Compound 1-1-1 in Comparative Example 27.

Comparative Example 43

Manufacture of Organic Light Emitting Diode

An organic light emitting diode was manufactured in the same manner as in Comparative Example 27, except that Compound 1-3-1 was used instead of Compound 1-1-1 in Comparative Example 27.

Comparative Example 44

Manufacture of Organic Light Emitting Diode

An organic light emitting diode was manufactured in the same manner as in Comparative Example 27, except that Compound 1-3-2 was used instead of Compound 1-1-1 in Comparative Example 27.

Comparative Example 45

Manufacture of Organic Light Emitting Diode

An organic light emitting diode was manufactured in the same manner as in Comparative Example 27, except that Compound 1-4-1 was used instead of Compound 1-1-1 in Comparative Example 27.

Comparative Example 46

Manufacture of Organic Light Emitting Diode

An organic light emitting diode was manufactured in the same manner as in Comparative Example 28, except that Compound 1-2-3 was used instead of Compound 1-1-1 in Comparative Example 28.

Comparative Example 47

Manufacture of Organic Light Emitting Diode

An organic light emitting diode was manufactured in the same manner as in Comparative Example 28, except that Compound 1-2-10 was used instead of Compound 1-1-1 in Comparative Example 28.

Comparative Example 49

Manufacture of Organic Light Emitting Diode

An organic light emitting diode was manufactured in the same manner as in Comparative Example 28, except that Compound 1-3-1 was used instead of Compound 1-1-1 in Comparative Example 28.

Comparative Example 50

Manufacture of Organic Light Emitting Diode

An organic light emitting diode was manufactured in the same manner as in Comparative Example 28, except that Compound 1-3-2 was used instead of Compound 1-1-1 in Comparative Example 28.

Comparative Example 51

Manufacture of Organic Light Emitting Diode

An organic light emitting diode was manufactured in the same manner as in Comparative Example 28, except that Compound 1-4-1 was used instead of Compound 1-1-1 in Comparative Example 28.

Comparative Example 52

Manufacture of Organic Light Emitting Diode

An organic light emitting diode was manufactured in the same manner as in Comparative Example 29, except that Compound 1-2-3 was used instead of Compound 1-1-1 in Comparative Example 29.

Comparative Example 53

Manufacture of Organic Light Emitting Diode

An organic light emitting diode was manufactured in the same manner as in Comparative Example 29, except that Compound 1-2-10 was used instead of Compound 1-1-1 in Comparative Example 29.

Comparative Example 54

Manufacture of Organic Light Emitting Diode

An organic light emitting diode was manufactured in the same manner as in Comparative Example 29, except that Compound 1-3-1 was used instead of Compound 1-1-1 in Comparative Example 29.

Comparative Example 55

Manufacture of Organic Light Emitting Diode

An organic light emitting diode was manufactured in the same manner as in Comparative Example 29, except that Compound 1-3-2 was used instead of Compound 1-1-1 in Comparative Example 29.

Comparative Example 56

Manufacture of Organic Light Emitting Diode

An organic light emitting diode was manufactured in the same manner as in Comparative Example 29, except that Compound 1-4-1 was used instead of Compound 1-1-1 in Comparative Example 29.

Comparative Example 57

Manufacture of Organic Light Emitting Diode

An organic light emitting diode was manufactured in the same manner as in Comparative Example 30, except that Compound 1-2-3 was used instead of Compound 1-1-1 in Comparative Example 30.

Comparative Example 58

Manufacture of Organic Light Emitting Diode

An organic light emitting diode was manufactured in the same manner as in Comparative Example 30, except that Compound 1-2-10 was used instead of Compound 1-1-1 in Comparative Example 30.

Comparative Example 59

Manufacture of Organic Light Emitting Diode

An organic light emitting diode was manufactured in the same manner as in Comparative Example 30, except that Compound 1-3-1 was used instead of Compound 1-1-1 in Comparative Example 30.

Comparative Example 60

Manufacture of Organic Light Emitting Diode

An organic light emitting diode was manufactured in the same manner as in Comparative Example 30, except that Compound 1-3-2 was used instead of Compound 1-1-1 in Comparative Example 30.

Comparative Example 61

Manufacture of Organic Light Emitting Diode

An organic light emitting diode was manufactured in the same manner as in Comparative Example 30, except that Compound 1-4-1 was used instead of Compound 1-1-1 in Comparative Example 30.

For the organic light emitting diodes manufactured by the above-described method, the driving voltage and the light emitting efficiency were measured at a current density of 10 mA/cm$^2$, and a time (LT98) for reaching a 98% value compared to the initial luminance was measured at a current density of 20 mA/cm$^2$. The results are shown in the following Table 1.

TABLE 1

| | Voltage (V) | Current efficiency (cd/A) | Color coordinate (x, y) | Life Time 98 at 20 mA/cm$^2$ |
|---|---|---|---|---|
| Example 1 | 4.15 | 5.66 | (0.137, 0.142) | 55 |
| Example 2 | 4.08 | 5.88 | (0.138, 0.142) | 51 |
| Example 3 | 4.1 | 5.87 | (0.138, 0.143) | 50 |
| Example 4 | 4.06 | 5.78 | (0.139, 0.143) | 58 |
| Example 5 | 3.89 | 5.88 | (0.138, 0.142) | 43 |
| Example 6 | 4.06 | 5.79 | (0.139, 0.142) | 57 |
| Example 7 | 4.14 | 5.58 | (0.138, 0.142) | 51 |
| Example 8 | 4.11 | 5.59 | (0.138, 0.143) | 58 |
| Example 9 | 4.13 | 5.61 | (0.138, 0.142) | 52 |
| Example 10 | 4.11 | 5.45 | (0.138, 0.143) | 51 |
| Example 11 | 4.10 | 5.77 | (0.138, 0.142) | 48 |

TABLE 1-continued

| | Voltage (V) | Current efficiency (cd/A) | Color coordinate (x, y) | Life Time 98 at 20 mA/cm² |
|---|---|---|---|---|
| Example 12 | 4.09 | 5.91 | (0.139, 0.142) | 51 |
| Example 13 | 4.08 | 5.84 | (0.139, 0.142) | 49 |
| Example 14 | 4.09 | 5.83 | (0.138, 0.142) | 35 |
| Example 15 | 4.1 | 5.71 | (0.138, 0.142) | 42 |
| Example 16 | 4.05 | 5.48 | (0.138, 0.142) | 71 |
| Example 17 | 4.1 | 5.87 | (0.138, 0.142) | 49 |
| Example 18 | 4.1 | 5.87 | (0.138, 0.142) | 55 |
| Example 19 | 4.1 | 5.87 | (0.138, 0.142) | 65 |
| Example 20 | 4.1 | 5.87 | (0.138, 0.142) | 48 |
| Example 21 | 4.1 | 5.87 | (0.138, 0.142) | 55 |
| Example 22 | 4.06 | 5.78 | (0.138, 0.142) | 59 |
| Example 23 | 4.09 | 5.78 | (0.138, 0.142) | 57 |
| Example 24 | 4.1 | 5.49 | (0.138, 0.142) | 52 |
| Example 25 | 4.12 | 5.71 | (0.138, 0.142) | 48 |
| Example 26 | 4.15 | 5.75 | (0.138, 0.142) | 44 |
| Example 27 | 3.91 | 5.63 | (0.138, 0.142) | 52 |
| Example 28 | 4.01 | 5.57 | (0.138, 0.142) | 54 |
| Example 29 | 4.04 | 5.62 | (0.138, 0.142) | 50 |
| Example 30 | 4.05 | 5.66 | (0.138, 0.142) | 49 |
| Example 31 | 3.99 | 5.63 | (0.138, 0.142) | 49 |
| Example 32 | 4.09 | 5.91 | (0.138, 0.142) | 48 |
| Example 33 | 4.1 | 5.55 | (0.138, 0.142) | 52 |
| Example 34 | 4.11 | 5.78 | (0.138, 0.142) | 56 |
| Example 35 | 4.07 | 5.69 | (0.138, 0.142) | 58 |
| Example 36 | 4.08 | 5.79 | (0.138, 0.142) | 58 |
| Comparative Example 1 | 4.45 | 5.15 | (0.138, 0.142) | 28 |
| Comparative Example 2 | 4.33 | 5.25 | (0.138, 0.142) | 14 |
| Comparative Example 3 | 4.38 | 5.21 | (0.138, 0.142) | 13 |
| Comparative Example 4 | 4.35 | 5.18 | (0.138, 0.143) | 25 |
| Comparative Example 5 | 4.29 | 5.28 | (0.138, 0.141) | 15 |
| Comparative Example 6 | 4.28 | 5.30 | (0.137, 0.142) | 21 |
| Comparative Example 7 | 4.39 | 5.16 | (0.138, 0.142) | 28 |
| Comparative Example 8 | 4.29 | 5.05 | (0.139, 0.142) | 5 |
| Comparative Example 9 | 4.24 | 4.84 | (0.138, 0.142) | 26 |
| Comparative Example 10 | 4.19 | 5.06 | (0.138, 0.142) | 22 |
| Comparative Example 11 | 4.31 | 5.03 | (0.138, 0.141) | 20 |
| Comparative Example 12 | 4.24 | 4.79 | (0.138, 0.142) | 20 |
| Comparative Example 13 | 4.3 | 4.89 | (0.138, 0.141) | 23 |
| Comparative Example 14 | 4.48 | 5.01 | (0.137, 0.142) | 15 |
| Comparative Example 15 | 4.39 | 5.06 | (0.138, 0.142) | 19 |
| Comparative Example 16 | 4.19 | 5.15 | (0.139, 0.142) | 9 |
| Comparative Example 17 | 4 | 5.05 | (0.138, 0.142) | 18 |
| Comparative Example 18 | 4.05 | 5.21 | (0.139, 0.142) | 19 |
| Comparative Example 19 | 5.01 | 5.29 | (0.138, 0.142) | 7 |
| Comparative Example 20 | 5.21 | 5.31 | (0.138, 0.142) | 15 |
| Comparative Example 21 | 5.33 | 5.29 | (0.138, 0.152) | 12 |
| Comparative Example 22 | 5.11 | 5.31 | (0.138, 0.146) | 15 |
| Comparative Example 23 | 5.18 | 5.28 | (0.138, 0.144) | 16 |
| Comparative Example 24 | 5.10 | 5.19 | (0.138, 0.142) | 11 |
| Comparative Example 253 | 5.01 | 5.19 | (0.138, 0.142) | 20 |
| Comparative Example 26 | 4.89 | 5.09 | (0.138, 0.142) | 23 |
| Comparative Example 27 | 4.99 | 5.07 | (0.138, 0.142) | 8 |
| Comparative Example 28 | 5.11 | 5.06 | (0.138, 0.141) | 14 |
| Comparative Example 29 | 4.88 | 5.02 | (0.138, 0.142) | 15 |
| Comparative Example 30 | 4.65 | 4.90 | (0.138, 0.142) | 18 |
| Comparative Example 31 | 4.55 | 5.13 | (0.138, 0.142) | 18 |
| Comparative Example 32 | 4.69 | 5.21 | (0.138, 0.142) | 14 |
| Comparative Example 33 | 4.70 | 4.90 | (0.138, 0.142) | 16 |
| Comparative Example 34 | 4.71 | 4.88 | (0.138, 0.142) | 11 |
| Comparative Example 35 | 4.75 | 4.89 | (0.138, 0.142) | 10 |
| Comparative Example 36 | 4.70 | 4.74 | (0.138, 0.142) | 31 |
| Comparative Example 37 | 4.59 | 5.10 | (0.138, 0.142) | 20 |
| Comparative Example 38 | 5.01 | 5.11 | (0.138, 0.142) | 18 |
| Comparative Example 39 | 4.96 | 5.09 | (0.138, 0.142) | 15 |
| Comparative Example 40 | 5.12 | 4.99 | (0.138, 0.142) | 17 |
| Comparative Example 41 | 5.13 | 5.00 | (0.138, 0.142) | 10 |
| Comparative Example 42 | 4.95 | 5.02 | (0.138, 0.142) | 16 |
| Comparative Example 43 | 5.16 | 4.91 | (0.138, 0.142) | 14 |
| Comparative Example 44 | 5.21 | 5.13 | (0.138, 0.142) | 18 |
| Comparative Example 45 | 4.98 | 5.11 | (0.138, 0.142) | 19 |
| Comparative Example 46 | 5.11 | 4.90 | (0.138, 0.142) | 21 |
| Comparative Example 47 | 5.09 | 4.88 | (0.138, 0.142) | 25 |
| Comparative Example 48 | 5.08 | 4.90 | (0.138, 0.142) | 18 |
| Comparative Example 49 | 5.1 | 4.74 | (0.138, 0.142) | 17 |
| Comparative Example 50 | 5.11 | 5.05 | (0.138, 0.142) | 25 |
| Comparative Example 51 | 4.78 | 4.89 | (0.138, 0.142) | 18 |
| Comparative Example 52 | 5.20 | 5.01 | (0.138, 0.142) | 21 |
| Comparative Example 53 | 5.21 | 5.02 | (0.138, 0.142) | 18 |
| Comparative Example 54 | 4.75 | 4.95 | (0.138, 0.142) | 23 |
| Comparative Example 55 | 4.95 | 5.13 | (0.138, 0.142) | 20 |
| Comparative Example 56 | 4.79 | 5.06 | (0.138, 0.142) | 14 |
| Comparative Example 57 | 4.92 | 4.71 | (0.138, 0.142) | 18 |
| Comparative Example 58 | 5.32 | 5.19 | (0.138, 0.142) | 16 |
| Comparative Example 59 | 5.22 | 5.14 | (0.138, 0.142) | 29 |
| Comparative Example 60 | 5.12 | 4.84 | (0.138, 0.142) | 30 |
| Comparative Example 61 | 5.11 | 4.75 | (0.138, 0.142) | 31 |

As in the results of Examples 1 to 36 and Comparative Examples 1 to 18 in Table 1, it can be confirmed that when the compound represented by Formula 1 is used as an electron adjusting layer, low driving voltage and high current efficiency are provided within the same or similar color coordinate range, and particularly, an organic light emitting diode having a long service life is provided.

Furthermore, as a result of Comparative Examples 19 to 24, it can be confirmed that when the electron adjusting layer represented by Formula 1 is provided between a light emitting layer and an electron transporting layer, the compound satisfying Formula 2 exhibits effects in terms of voltage, efficiency, and/or life time in the organic light emitting diode, and that the results of Comparative Examples 25 to 61 show clear differences in performance of the organic light emitting diodes in connection with the thicknesses of the electron adjusting layer and the electron transporting layer.

Therefore, when combining organic light emitting diodes including both the electron adjusting layer represented by Formula 1 and the electron transporting layer represented by Formula 2 according to an exemplary embodiment of the present specification, it is possible to provide an organic light emitting diode having high efficiency and a long service life.

The invention claimed is:
1. An organic light emitting diode comprising:
a cathode;
an anode provided to face the cathode;
a light emitting layer provided between the cathode and the anode;
an electron transporting layer provided between the cathode and the light emitting layer; and
an electron adjusting layer provided between the light emitting layer and the electron transporting layer,
wherein the electron transporting layer comprises an organic compound containing an aromatic hetero ring,
the electron adjusting layer comprises a heterocyclic compound represented by the following Formula 1, and
an ionization potential ($Ip_m$) of the electron transporting layer is larger than an ionization potential ($IP_a$) of the electron adjusting layer:

[Formula 1]

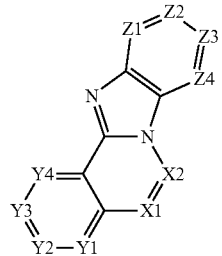

in Formula 1,
X1 is CR1 or N and X2 is CR2 or N,
Y1 is CR5 or N, Y2 is CR6 or N, Y3 is CR7 or N, and Y4 is CR8 or N,
Z1 is CR9 or N, Z2 is CR10 or N, Z3 is CR11 or N, and Z4 is CR12 or N,
X1, X2, Y1 to Y4, and Z1 to Z4 are not simultaneously N, and
R1, R2, and R5 to R12 are the same as or different from each other, and are each independently hydrogen; deuterium; a substituted or unsubstituted aryl group having 6 to 30 carbon atoms; a substituted or unsubstituted heterocyclic group having 2 to 30 carbon atoms; or a substituted or unsubstituted phosphine oxide group, or adjacent substituents of R1, R2, and R5 to R12 combine with each other to form a substituted or unsubstituted hydrocarbon ring; or a substituted or unsubstituted hetero ring.

2. The organic light emitting diode of claim 1, wherein the electron adjusting layer is provided to be in contact with the light emitting layer.

3. The organic light emitting diode of claim 1, wherein a thickness of the electron transporting layer is larger than a thickness of the electron adjusting layer.

4. The organic light emitting diode of claim 1, wherein the heterocyclic compound represented by Formula 1 is represented by the following Formula 1A or 1B:

[Formula 1A]

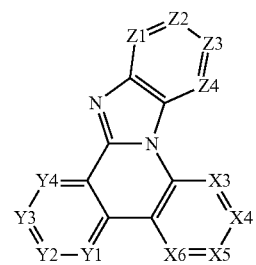

[Formula 1B]

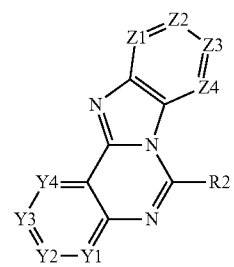

in Formulae 1A and 1B,
Y1 to Y4, Z1 to Z4, and R2 are the same as those defined in Formula 1,
X3 to X6 are the same as or different from each other, and are each independently CR3 or N, and
R3's are each independently hydrogen; deuterium; a substituted or unsubstituted aryl group having 6 to 30 carbon atoms; a substituted or unsubstituted heterocyclic group having 2 to 30 carbon atoms; or a substituted or unsubstituted phosphine oxide group, or adjacent substituents combine with each other to form a substituted or unsubstituted hydrocarbon ring; or a substituted or unsubstituted hetero ring.

5. The organic light emitting diode of claim 1, wherein the heterocyclic compound represented by Formula 1 is represented by any one of the following Formulae 1-1 to 1-4:

[Formula 1-1]

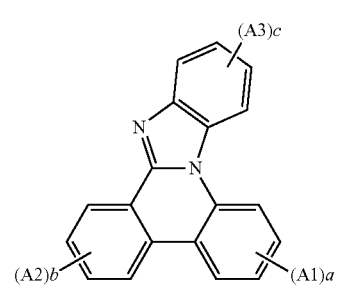

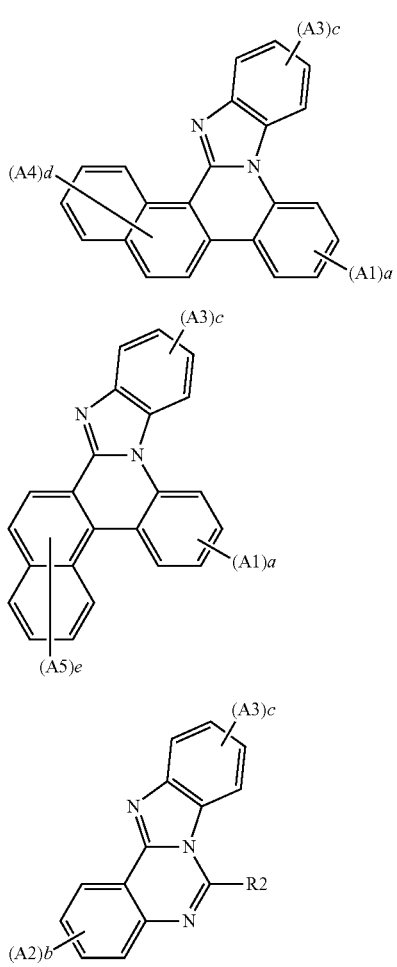

[Formula 1-2]

[Formula 1-3]

[Formula 1-4]

in Formulae 1-1 to 1-4,
a, b, and c are each an integer of 1 to 4,
d and e are each an integer of 1 to 6, and
when a, b, c, d, and e are each an integer of 2 or more, the two or more structures in the parenthesis are the same as or different from each other, and
A1 to A5 and R2 are the same as or different from each other, and each independently hydrogen; deuterium; a substituted or unsubstituted aryl group having 6 to 30 carbon atoms; a substituted or unsubstituted heterocyclic group having 2 to 30 carbon atoms; or a substituted or unsubstituted phosphine oxide group.

6. The organic light emitting diode of claim 1, wherein at least one of R1, R2, and R5 to R12 is an aryl group which is unsubstituted or substituted with one or two or more substituents selected from the group consisting of a cyano group, an aryl group, a heterocyclic group, and a phosphine oxide group; or a phosphine oxide group which is unsubstituted or substituted with one or two or more substituents selected from the group consisting of a cyano group, an aryl group, a heterocyclic group, and a phosphine oxide group, or adjacent substituents combine with each other to form a hydrocarbon ring which is unsubstituted or substituted with one or two or more substituents selected from the group consisting of a cyano group, an aryl group, a heterocyclic group, and a phosphine oxide group.

7. The organic light emitting diode of claim 1, wherein the heterocyclic compound represented by Formula 1 is represented by any one of the following Formulae 1-1-1 to 1-1-7, 1-2-1 to 1-2-10, 1-3-1 to 1-3-5, and 1-4-1 to 1-4-7:

[Formula 1-1-1]

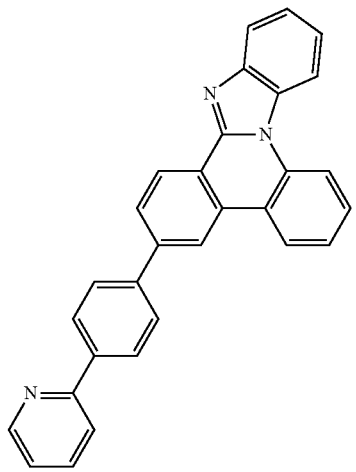

[Formula 1-1-2]

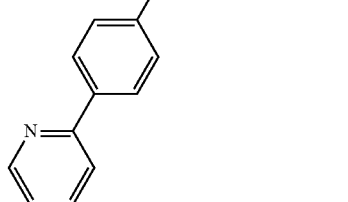

[Formula 1-1-3]

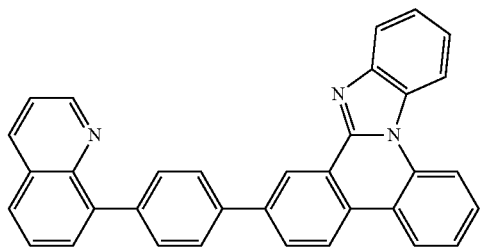

[Formula 1-1-4]

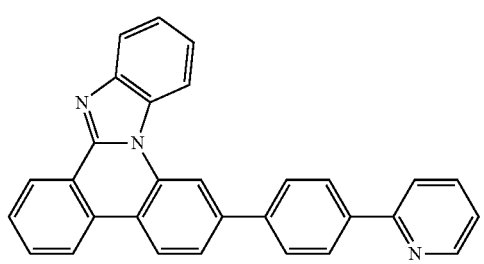

[Formula 1-1-5]
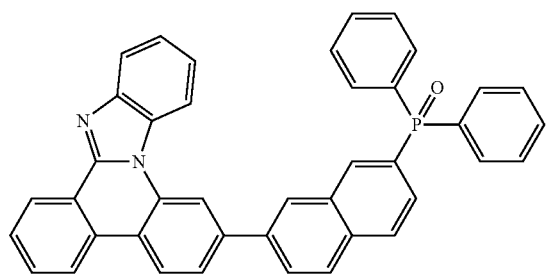
[Formula 1-1-6]
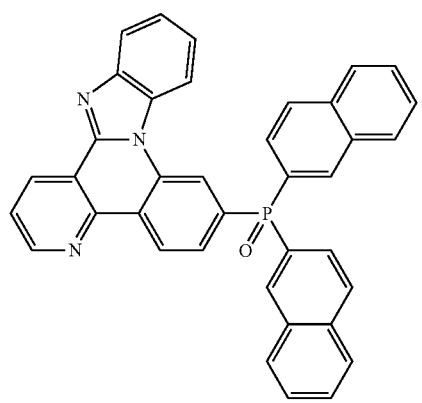
[Formula 1-1-7]
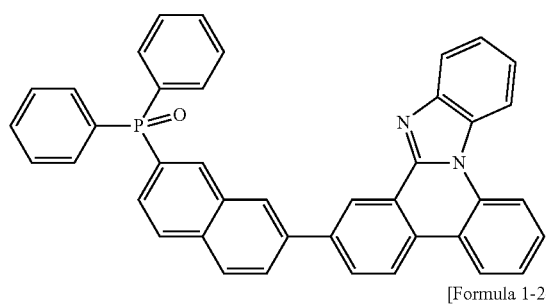
[Formula 1-2-1]
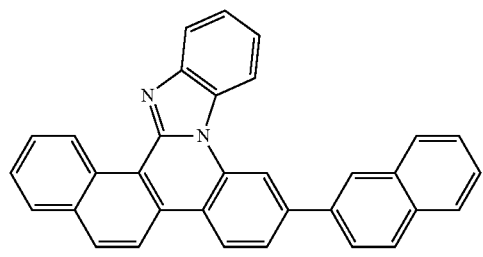
[Formula 1-2-2]
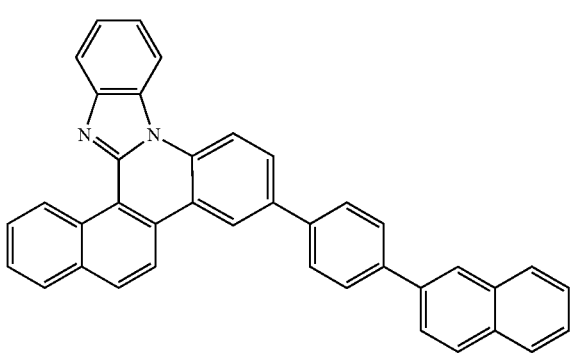
[Formula 1-2-3]
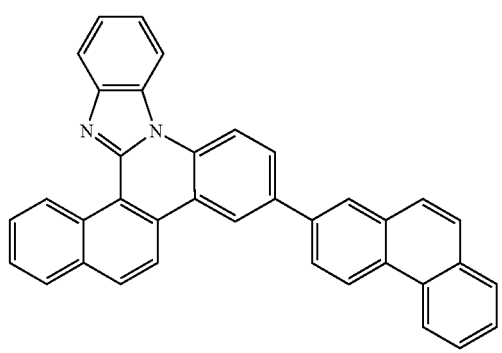
[Formula 1-2-4]
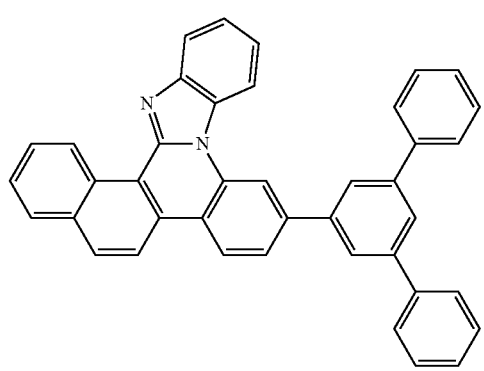
[Formula 1-2-5]
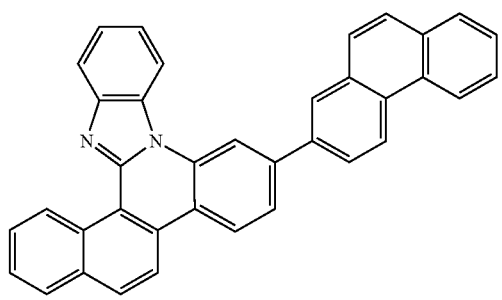
[Formula 1-2-6]
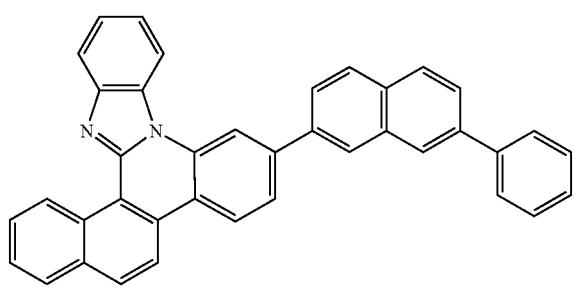
[Formula 1-2-7]

[Formula 1-2-8]
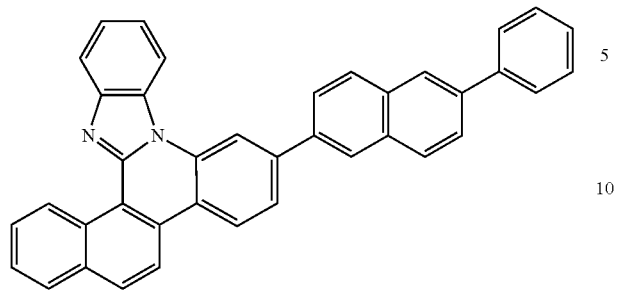
[Formula 1-2-9]
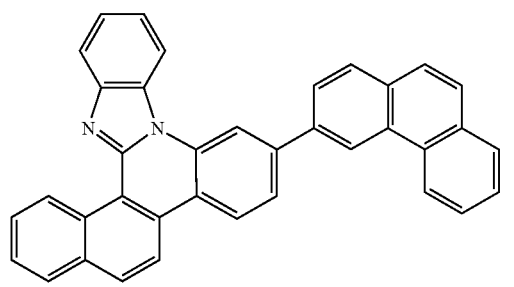
[Formula 1-2-10]
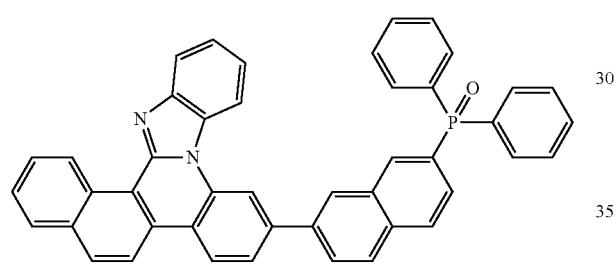
[Formula 1-3-1]
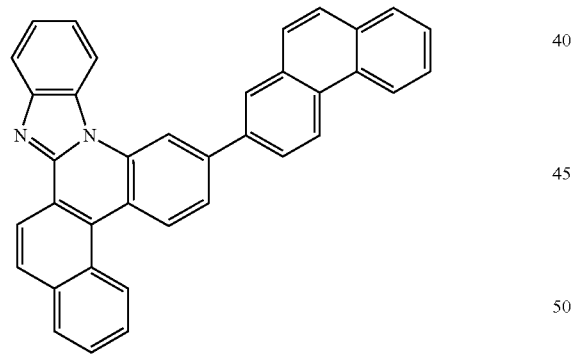
[Formula 1-3-2]
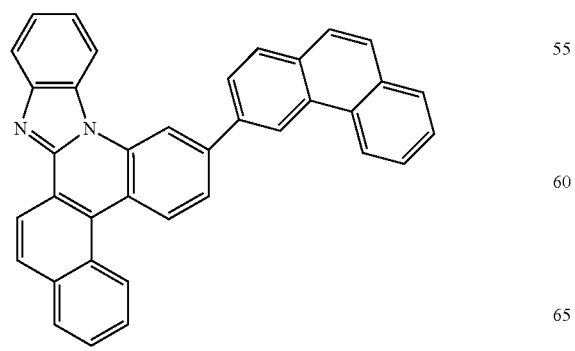
[Formula 1-3-3]
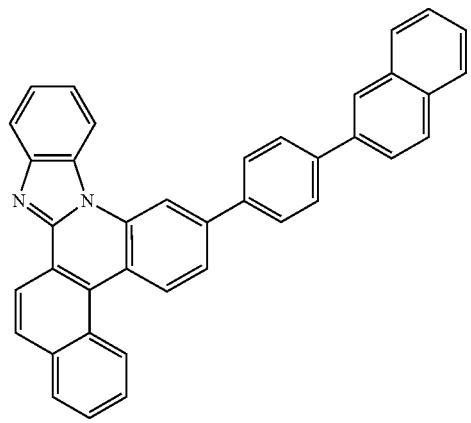
[Formula 1-3-4]
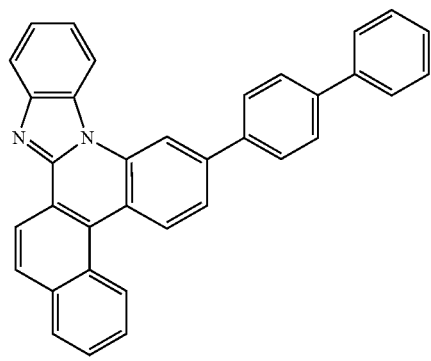
[Formula 1-3-5]
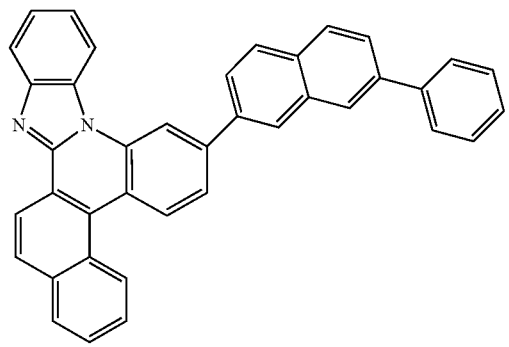

[Formula 1-4-1]
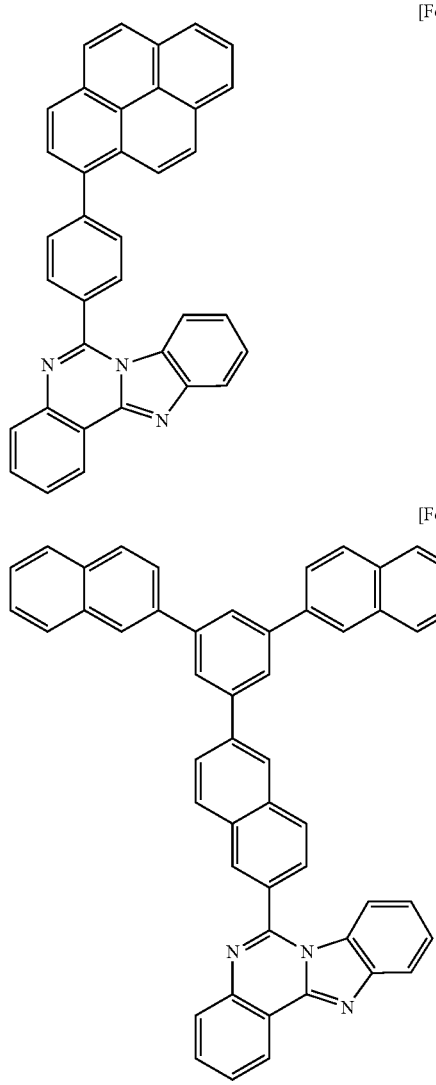
[Formula 1-4-2]
[Formula 1-4-3]
[Formula 1-4-4]
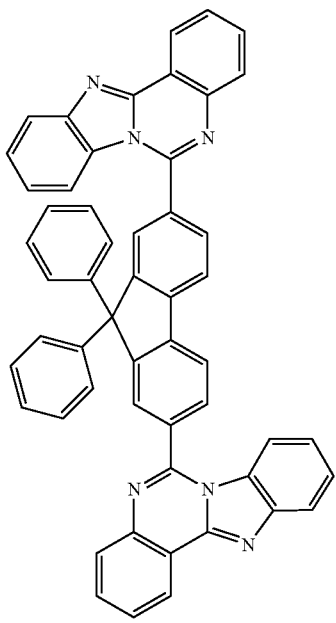
[Formula 1-4-5]
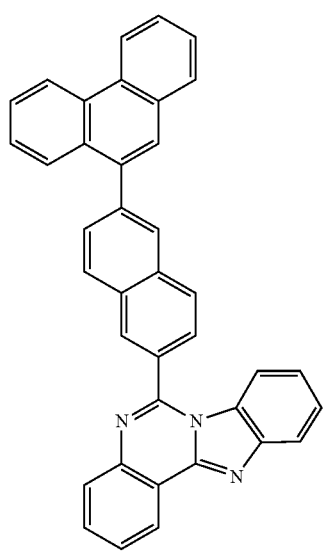
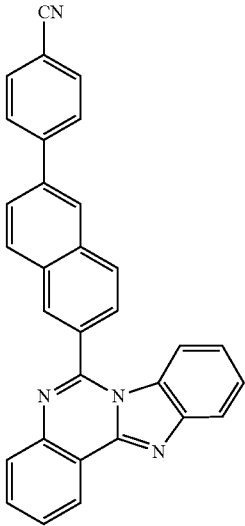

-continued

[Formula 1-4-6]

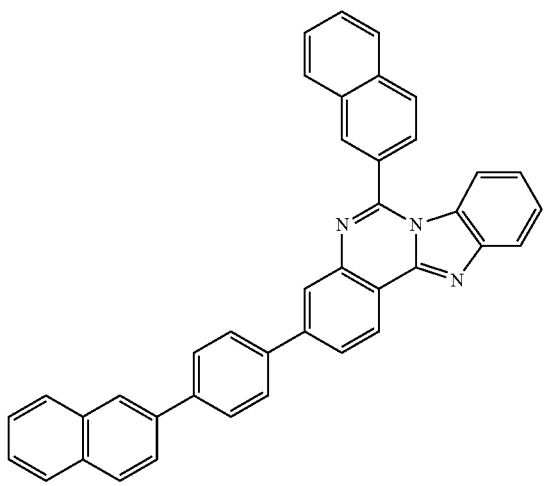

[Formula 1-4-7]

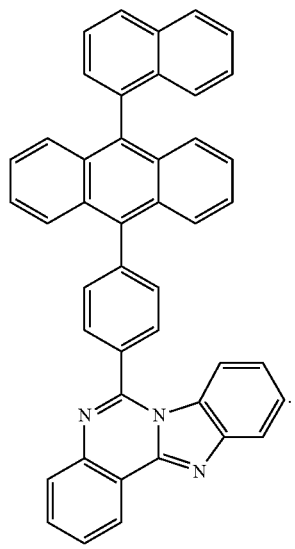

8. The organic light emitting diode of claim 1, wherein the electron transporting layer comprises an organic compound containing an aromatic hetero ring represented by the following Formula 2:

[Formula 2]

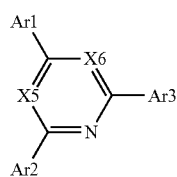

in Formula 2,

X5 and X6 are the same as or different from each other, and are each independently N or CH, and Ar1 to Ar3 are the same as or different from each other, and are each independently a substituted or unsubstituted aryl group having 6 to 30 carbon atoms; or a substituted or unsubstituted heterocyclic group having 2 to 30 carbon atoms.

9. The organic light emitting diode of claim 8, wherein Ar1 and Ar3 are the same as or different from each other, and each independently a substituted or unsubstituted phenyl group; a substituted or unsubstituted biphenyl group; a substituted or unsubstituted naphthyl group; or a substituted or unsubstituted fluorenyl group.

10. The organic light emitting diode of claim 8, wherein at least one of Ar1 to Ar3 is represented by the following Formula 3:

[Formula 3]

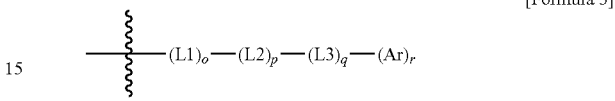

in Formula 3, o, p, and q are 0 or 1, $1 \leq o+p+q \leq 3$, r is 1 or 2, and when r is 2, two Ar's are the same as or different from each other, L1 to L3 are the same as or different from each other, and are each independently a phenylene group; or a naphthalene group; or a fluorenylene group, and Ar is an aryl group which is unsubstituted or substituted with one or two or substituents selected from the group consisting of an aryl group and a heterocyclic group; or a heterocyclic group which is unsubstituted or substituted with one or two or more substituents selected from the group consisting of an aryl group and a heterocyclic group.

11. The organic light emitting diode of claim 8, wherein the organic compound containing the aromatic hetero ring represented by Formula 2 is represented by any one of the following Formulae 2-1 to 2-13:

[Formula 2-1]

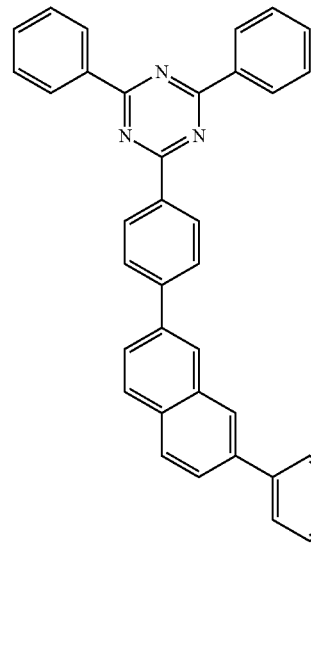

[Formula 2-2]
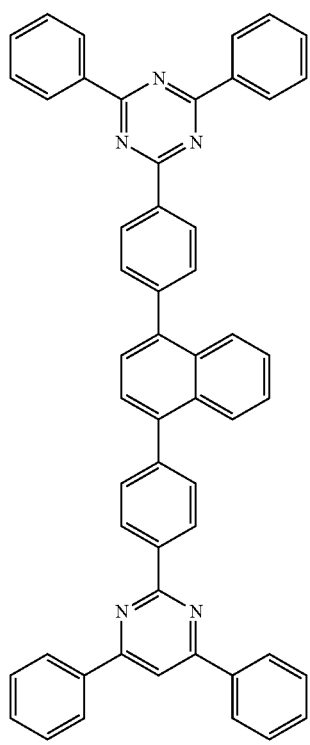
[Formula 2-3]
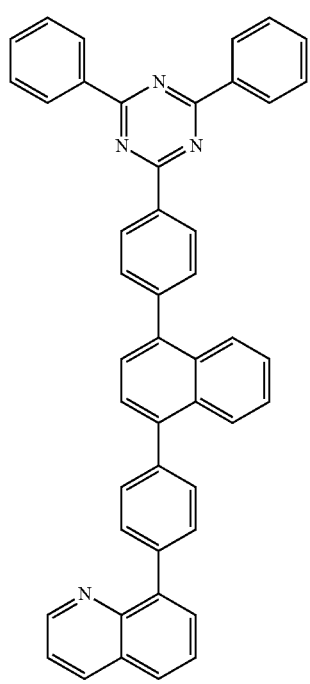
[Formula 2-4]
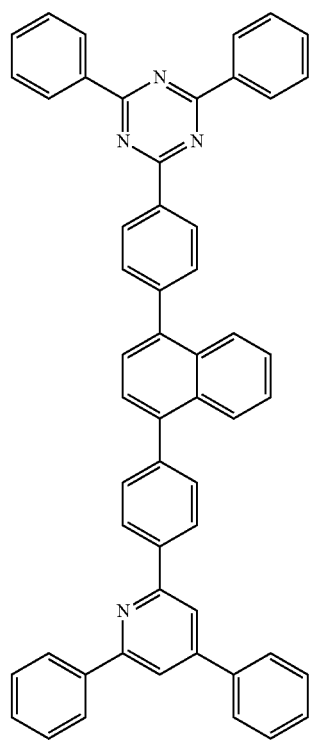
[Formula 2-5]
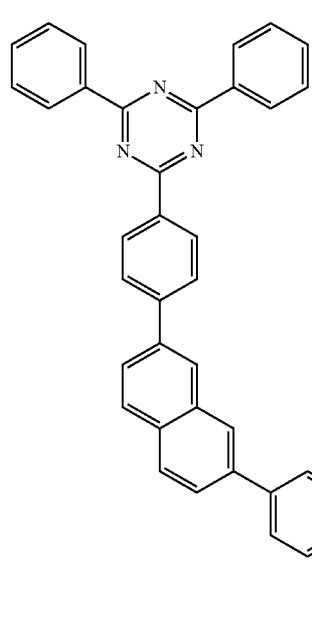

[Formula 2-6]
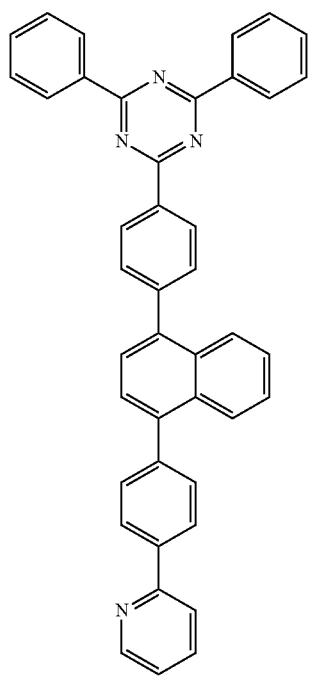
[Formula 2-7]
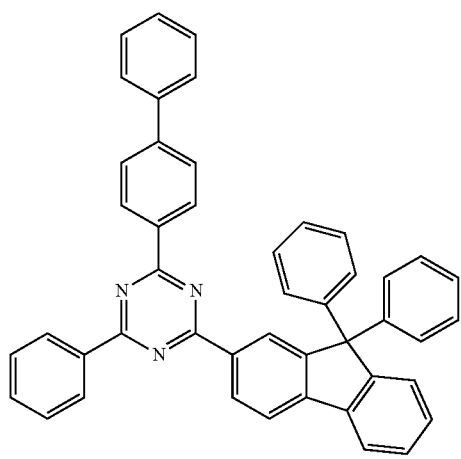
[Formula 2-8]
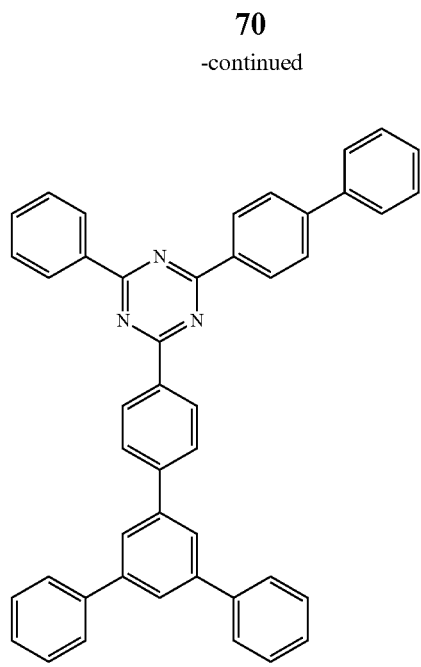
[Formula 2-9]
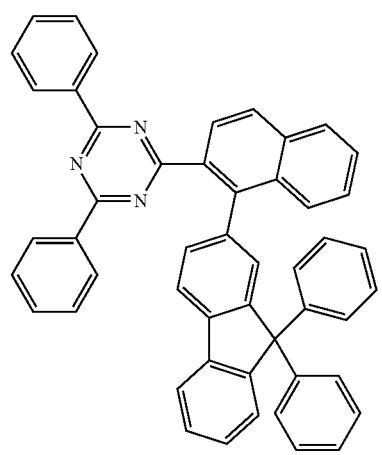

-continued

[Formula 2-10]

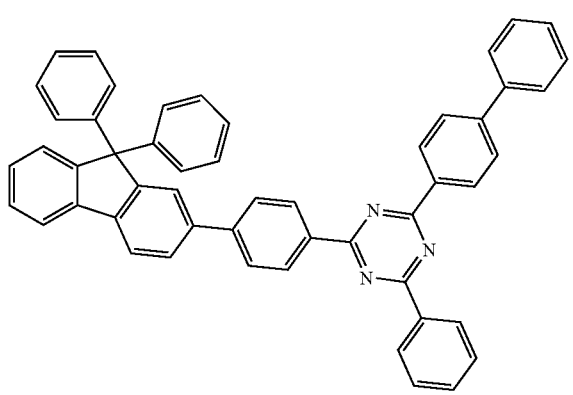

[Formula 2-11]

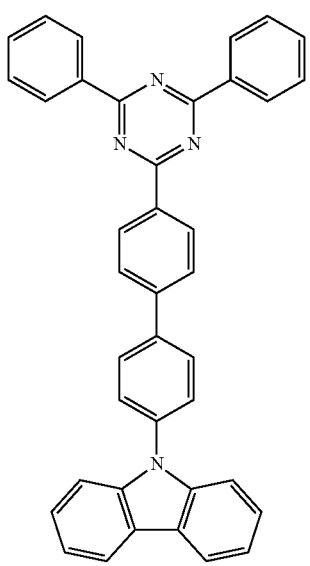

-continued

[Formula 2-12]

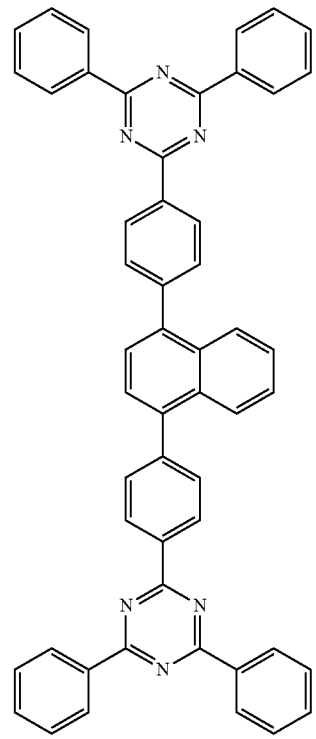

[Formula 2-13]

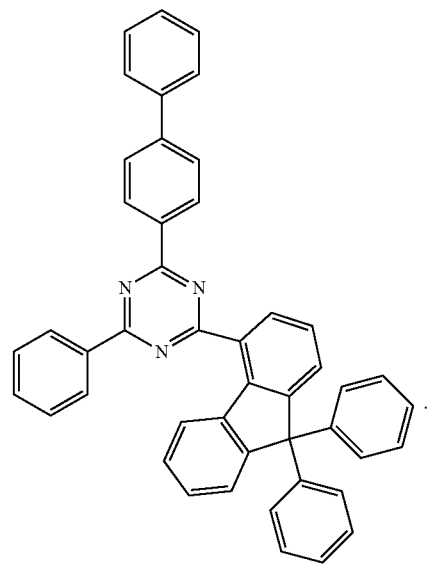

12. The organic light emitting diode of claim 1, wherein the organic light emitting diode emits blue fluorescent light.

13. The organic light emitting diode of claim 1, wherein the organic light emitting diode further comprises one or two or more layers selected from the group consisting of a hole injection layer, a hole transporting layer, an electron transporting layer, an electron injection layer, an electron blocking layer, and a hole blocking layer.

* * * * *